US009887010B2

(12) United States Patent
Asami

(10) Patent No.: US 9,887,010 B2
(45) Date of Patent: Feb. 6, 2018

(54) SEMICONDUCTOR DEVICE, MEMORY DEVICE, AND DRIVING METHOD THEREOF

(71) Applicant: Semiconductor Energy Laboratory Co., Ltd., Atsugi-shi, Kanagawa-ken (JP)

(72) Inventor: Yoshinobu Asami, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/404,282

(22) Filed: Jan. 12, 2017

(65) Prior Publication Data

US 2017/0213598 A1 Jul. 27, 2017

(30) Foreign Application Priority Data

Jan. 21, 2016 (JP) .................................. 2016-009389

(51) Int. Cl.
*G11C 16/04* (2006.01)
*G11C 16/24* (2006.01)
(Continued)

(52) U.S. Cl.
CPC .......... *G11C 16/24* (2013.01); *G11C 16/0483* (2013.01); *G11C 16/14* (2013.01);
(Continued)

(58) Field of Classification Search
CPC . G11C 16/0483; G11C 16/08; G11C 16/3459; G11C 8/10; G11C 11/404;
(Continued)

(56) References Cited

U.S. PATENT DOCUMENTS 4,466,081 A   8/1984 Masuoka
5,534,884 A   7/1996 Mase et al.
(Continued)

FOREIGN PATENT DOCUMENTS

EP   1737044 A   12/2006
EP   2226847 A   9/2010
(Continued)

OTHER PUBLICATIONS

Asakuma.N et al., "Crystallization and Reduction of SOL-GEL-Derived Zinc Oxide Films by Irradiation With Ultraviolet Lamp", Journal of SOL-GEL Science and Technology, 2003, vol. 26, pp. 181-184.
(Continued)

*Primary Examiner* — Thong Q Le
(74) *Attorney, Agent, or Firm* — Fish & Richardson P.C.

(57) ABSTRACT

Provided is a highly integrated semiconductor device which can hold data and includes a NAND cell array. Each of the plurality of memory cells of the NAND cell array includes a first transistor, a second transistor, a first terminal, a second terminal, a third terminal, and a fourth terminal. The first terminal is electrically connected to one electrode connected to a channel region of the first transistor. The second terminal is electrically connected to the other electrode connected to the channel region of the first transistor. The third terminal is electrically connected to a gate electrode of the second transistor. The fourth terminal is electrically connected to one electrode connected to a channel region of the second transistor. A gate electrode of the first transistor is in contact with the other electrode connected to the channel region of the second transistor. A string of the plurality of memory cells is formed by connecting the first terminals and the second terminals.

7 Claims, 19 Drawing Sheets

(51) Int. Cl.

| | | |
|---|---|---|
| *G11C 16/14* | (2006.01) | |
| *G11C 16/26* | (2006.01) | |
| *H01L 23/535* | (2006.01) | |
| *H01L 27/02* | (2006.01) | |
| *H01L 27/11524* | (2017.01) | |
| *H01L 27/11556* | (2017.01) | |
| *H01L 27/1157* | (2017.01) | |
| *H01L 27/11582* | (2017.01) | |
| *H01L 29/24* | (2006.01) | |
| *H01L 29/423* | (2006.01) | |
| *H01L 29/788* | (2006.01) | |
| *H01L 29/792* | (2006.01) | |

(52) U.S. Cl.
CPC ............ *G11C 16/26* (2013.01); *H01L 23/535* (2013.01); *H01L 27/0207* (2013.01); *H01L 27/1157* (2013.01); *H01L 27/11524* (2013.01); *H01L 27/11556* (2013.01); *H01L 27/11582* (2013.01); *H01L 29/24* (2013.01); *H01L 29/4234* (2013.01); *H01L 29/42324* (2013.01); *H01L 29/788* (2013.01); *H01L 29/792* (2013.01)

(58) Field of Classification Search
CPC .............. G11C 11/4097; G11C 11/412; G11C 11/5628; G11C 11/5642; G11C 14/00; G11C 14/0018; G11C 16/02; G11C 16/04; G11C 16/0408; G11C 16/0416
USPC ............ 365/185.17, 185.11, 185.18, 230.03, 365/230.06, 184, 185.01, 185.03, 185.05, 365/185.08, 185.13, 185.24, 185.26
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,982,471 A | 11/1999 | Hirakata et al. |
| 6,169,532 B1 | 1/2001 | Sumi et al. |
| 6,266,038 B1 | 7/2001 | Yoshida et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,961,042 B2 | 11/2005 | Murai |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,098,880 B2 | 8/2006 | Inoue et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,737,517 B2 | 6/2010 | Kawamura et al. |
| 8,067,775 B2 | 11/2011 | Miyairi et al. |
| 8,378,403 B2 | 2/2013 | Kato |
| 8,809,853 B2 | 8/2014 | Saito et al. |
| 8,854,865 B2 | 10/2014 | Saito |
| 2001/0020928 A1 | 9/2001 | Yanagisawa et al. |
| 2001/0046027 A1 | 11/2001 | Tai et al. |
| 2002/0003271 A1 | 1/2002 | Ikeda et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0219188 A1 | 10/2005 | Kawabe et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0205976 A1 | 9/2007 | Takatori et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0042968 A1 | 2/2008 | Oh |
| 2008/0050595 A1 | 2/2008 | Nakagawara et al. |
| 2008/0055218 A1 | 3/2008 | Tsuda et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284970 A1 | 11/2008 | Ishitani |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0079684 A1 | 3/2009 | Watanabe |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0065844 A1 | 3/2010 | Tokunaga |
| 2010/0092800 A1 | 4/2010 | Itagaki et al. |

(56) References Cited

U.S. PATENT DOCUMENTS

| | | |
|---|---|---|
| 2010/0109002 A1 | 5/2010 | Itagaki et al. |
| 2010/0244020 A1 | 9/2010 | Sakata et al. |
| 2011/0122670 A1 | 5/2011 | Yamazaki et al. |
| 2011/0134683 A1 | 6/2011 | Yamazaki et al. |
| 2011/0227074 A1 | 9/2011 | Kato et al. |
| 2012/0001243 A1 | 1/2012 | Kato |
| 2012/0032164 A1 | 2/2012 | Ohnuki |
| 2012/0061668 A1 | 3/2012 | Miyairi et al. |
| 2012/0062267 A1* | 3/2012 | Saito .................... G11C 11/403 324/762.01 |
| 2012/0075917 A1 | 3/2012 | Takemura |
| 2012/0161220 A1 | 6/2012 | Yamazaki |
| 2012/0262982 A1 | 10/2012 | Takemura |
| 2012/0292613 A1 | 11/2012 | Shionoiri et al. |
| 2012/0294068 A1 | 11/2012 | Ishizu |
| 2012/0294102 A1 | 11/2012 | Ishizu |
| 2013/0069132 A1 | 3/2013 | Atsumi et al. |
| 2013/0140569 A1 | 6/2013 | Yoneda et al. |
| 2013/0221356 A1 | 8/2013 | Yamazaki et al. |
| 2013/0228839 A1 | 9/2013 | Arai |
| 2013/0258746 A1 | 10/2013 | Kurokawa |
| 2013/0326309 A1 | 12/2013 | Yoneda |
| 2014/0325249 A1 | 10/2014 | Toyotaka |
| 2014/0339541 A1 | 11/2014 | Kato et al. |
| 2014/0374747 A1 | 12/2014 | Kurokawa |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers. 2004, vol. 35, pp. 860-863.

Janotti.A et al., "Native Point Defects in ZnO", Phys. Rev. B (Physical Review. B), Oct. 4, 2007, vol. 76, No. 16. pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array". SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO

(56) References Cited

OTHER PUBLICATIONS

Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, Vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B). 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs with a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

(56) References Cited

OTHER PUBLICATIONS

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

|  | Read | Write | Erase |
| --- | --- | --- | --- |
| Bit Line 180 | 0 | +H | +H |
| Source Line 182 | 0 | +H | +H |
| Bit Line 181 | +L | 0 | 0 |
| Source Line 183 | 0 | 0 | 0 |
| Gate Line 171 | 0 | 0 | 0 |
| Word Line 175 | +H | +H | +H |
| Gate Line 172 | 0 | 0 | 0 |
| Word Line 176 | +H | +H | +H |
| Gate Line 173 | 0 | 0 | +H |
| Word Line 177 | +L | −H | +H |
| Gate Line 174 | 0 | 0 | 0 |
| Word Line 178 | +H | +H | +H |
| Select Line 170 | +L | +L | +L |

|  | Read | Write | Erase |
|---|---|---|---|
| Bit Line 180 | 0 | +H | +H |
| Source Line 182 | 0 | +H | +H |
| Bit Line 181 | +L | 0 | 0 |
| Source Line 183 | 0 | 0 | 0 |
| Gate Line 171 | 0 | 0 | 0 |
| Word Line 175 | +L | +H | +H |
| Gate Line 172 | 0 | 0 | 0 |
| Word Line 176 | +L | +H | +H |
| Gate Line 173 | 0 | +H | 0 |
| Word Line 177 | 0 | +H | −H |
| Gate Line 174 | 0 | 0 | 0 |
| Word Line 178 | +L | +H | +H |
| Select Line 170 | +L | +L | +L |

SEMICONDUCTOR DEVICE, MEMORY DEVICE, AND DRIVING METHOD THEREOF

BACKGROUND OF THE INVENTION

1. Field of the Invention

One embodiment of the present invention relates to a semiconductor device, a memory device, and a driving method thereof.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, or an electronic device includes a semiconductor device.

2. Description of the Related Art

Flash memories have been widely used as non-volatile memory devices (e.g., see Patent Document 1). Flash memories can be divided into a NOR type and a NAND type according to the driving methods. The NOR flash memories have the advantage of high-speed operation, whereas the NAND flash memories have the advantage of high integration owing to a smaller wiring pitch and a smaller area per bit.

In recent years, new non-volatile memory devices have been suggested in which a transistor including an oxide semiconductor in the channel formation region (hereinafter, referred to as OS transistor) and a transistor including silicon in the channel formation region (hereinafter, referred to as Si transistor) are used in combination (e.g., see Patent Documents 2 and 3).

REFERENCES

Patent Document

[Patent Document 1] Japanese Published Patent Application No. S57-105889
[Patent Document 2] United States Published Patent Application No. 2013/0228839
[Patent Document 3] United States Published Patent Application No. 2013/0221356

SUMMARY OF THE INVENTION

Flash memories need high voltage for injection of electric charge to the floating gate or for removal of the electric charge, and thus, also need a circuit for generating the high voltage.

Furthermore, for a conventional circuit configuration including an OS transistor and a Si transistor, a reduction in cell size and an increase in integration are demanded.

In view of the above problems, an object of one embodiment of the present invention is to provide a semiconductor device for holding of data. Another object is to provide a highly integrated semiconductor device. Another object is to provide a semiconductor device having a substantially unlimited number of write cycles. Another object of one embodiment of the present invention is to provide a semiconductor device with high reliability. Another object is to provide a semiconductor device with excellent data retention capability. Another object is to provide a novel semiconductor device or the like. Another object is to provide a method for driving the semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a memory device comprising a NAND cell array. The NAND cell array includes a plurality of memory cells Each of the plurality of memory cells comprises a first transistor, a second transistor, a first terminal, a second terminal, a third terminal, and a fourth terminal. The first terminal is electrically connected to one electrode connected to a channel region of the first transistor. The second terminal is electrically connected to the other electrode connected to the channel region of the first transistor. The third terminal is electrically connected to a gate electrode of the second transistor. The fourth terminal is electrically connected to one electrode connected to a channel region of the second transistor. A gate electrode of the first transistor is in contact with the other electrode connected to the channel region of the second transistor. The first terminals and the second terminals are connected in a string. The third terminal is connected to a word line. The fourth terminal is connected to a driver circuit.

Another embodiment of the present invention is a semiconductor device comprising a bit line, a selection transistor, m word lines (m is a natural number greater than or equal to 3), a source line, m signal lines, a first to m-th memory cells, a first driver circuit electrically connected to the bit line, a second driver circuit electrically connected to the word lines, a third driver circuit electrically connected to the signal lines, a fourth driver circuit electrically connected to a gate electrode of the selection transistor, and a fifth driver circuit electrically connected to the source line. Each of the first to m-th memory cells comprises a first terminal, a second terminal, a third terminal, a fourth terminal, a first semiconductor layer, a drain electrode connected to the first semiconductor layer, a source electrode connected to the first semiconductor layer, a first gate insulating film over the first semiconductor layer, a first gate electrode over the first gate insulating film, a second semiconductor layer over the first gate electrode, a conductive layer over the second semiconductor layer, a second gate insulating film covering the second semiconductor layer and the conductive layer, and a second gate electrode covering at least part of a side surface of the second semiconductor layer with the second gate insulating film therebetween. An end portion of the second semiconductor layer has a shape substantially conforming to an end portion of the conductive layer. The drain electrode is electrically connected to the first terminal. The source electrode is electrically connected to the second terminal. The conductive layer is electrically connected to the second terminal. The second gate electrode is electrically connected to the fourth terminal. The first terminal of the first memory cell is electrically connected to a drain electrode of the selection transistor. The drain electrode of the selection transistor is electrically connected to the bit line. The first terminal of the j-th memory cell is electrically connected to the second terminal of the (j−1)-th memory cell. Note that j is a natural number greater than or equal to 2 and less than or equal to m. The second terminal of the m-th memory cell is electrically connected to the source line. The third terminal of the k-th memory cell is electrically connected to the k-th word line. Note that k is a natural number greater than or equal to 1 and less than or equal to m. The k-th signal line is electrically connected to the fourth terminal of the k-th memory cell.

Another embodiment of the present invention is a semiconductor device comprising a bit line, a selection transistor, m word lines (m is a natural number greater than or equal to 3), a source line, m signal lines, a first to m-th memory cells, a first driver circuit electrically connected to the bit line, a second driver circuit electrically connected to the word lines, a third driver circuit electrically connected to the signal lines, a fourth driver circuit electrically connected to a gate electrode of the selection transistor, and a fifth driver circuit electrically connected to the source line. Each of the first to m-th memory cells comprises a first terminal, a second terminal, a third terminal, a fourth terminal, a first semiconductor layer, a pair of electrodes over the first semiconductor layer, an interlayer film over the pair of electrodes, the interlayer film including an opening, a first gate insulating film in contact with a top surface of the first semiconductor layer in the opening, a first gate electrode over the first gate insulating film, a second semiconductor layer over the first gate electrode, a conductive layer over the second semiconductor layer, a second gate insulating film covering the second semiconductor layer and the conductive layer, and a second gate electrode covering at least part of a side surface of the second semiconductor layer with the second gate insulating film therebetween. An end portion of the second semiconductor layer has a shape conforming to an end portion of the conductive layer. One of the pair of electrodes is electrically connected to the first terminal. The other of the pair of electrodes is electrically connected to the second terminal. The conductive layer is electrically connected to the second terminal. The second gate electrode is electrically connected to the fourth terminal. The first terminal of the first memory cell is electrically connected to a drain electrode of the selection transistor. The drain electrode of the selection transistor is electrically connected to the bit line. The first terminal of the j-th memory cell is electrically connected to the second terminal of the (j−1)-th memory cell. Note that j is a natural number greater than or equal to 2 and less than or equal to m. The second terminal of the m-th memory cell is electrically connected to the source line. The third terminal of the k-th memory cell is electrically connected to the k-th word line. Note that k is a natural number greater than or equal to 1 and less than or equal to m. The k-th signal line is electrically connected to the fourth terminal of the k-th memory cell.

The semiconductor device according to claim 2 or claim 3, wherein the first semiconductor layer and the second semiconductor layer are oxide semiconductor layers.

Another embodiment of the present invention is a method for driving a memory device. The memory device comprises a memory cell, the memory cell comprising a first semiconductor layer, a first gate insulating film over the first semiconductor layer, a first gate electrode over the first gate insulating film, a second semiconductor layer over the first gate electrode, a conductive layer over the second semiconductor layer, a second gate insulating film covering the conductive layer and the second semiconductor layer, and a second gate electrode covering at least part of a side surface of the second semiconductor layer with the second gate insulating film therebetween. The first gate electrode, the second semiconductor layer, and the conductive layer overlap with one another.

In the method for driving the memory device, data is written to the memory device in such a manner that the conductive layer is electrically connected to the first gate electrode through the second semiconductor under application of an appropriate voltage to the first gate electrode, so that data can be written to the memory device. The conductive layer is disconnected to the first gate electrode under application of another appropriate voltage to the first gate electrode using a coupling capacitor, so that the data can be read as the conductivity of the first semiconductor layer is lowered. The method for driving the memory device is characterized in that the first gate electrode has three or more kinds of different potentials when the data is written to the memory device, and that the data is written, erased, and read page by page composed of a plurality of memory cells that shares a word line.

In each of the above embodiments, it is preferable that the semiconductor layer be an oxide semiconductor layer.

With use of one embodiment of the present invention, a semiconductor device that can hold data can be provided. A highly integrated semiconductor device can be provided. A semiconductor device having a substantially unlimited number of write cycles can be provided. A highly reliable semiconductor device can be provided. A semiconductor device with excellent data retention capability can be provided. A novel semiconductor device or the like can be provided. A driving method thereof can be provided.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

DETAILED DESCRIPTION OF THE INVENTION

Figure 1A:
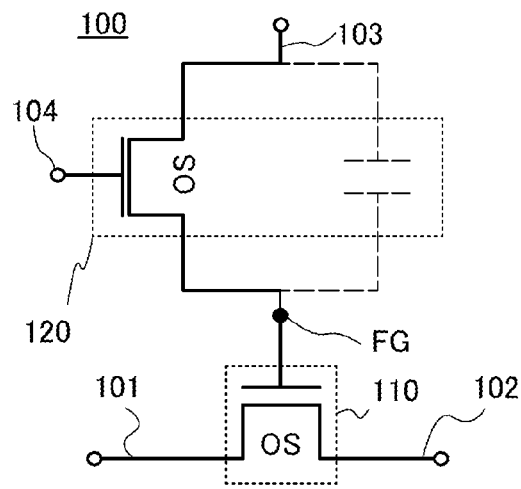
FIGS. 1A to 1C are circuit diagrams of a semiconductor device.

Hereinafter, embodiments will be described with reference to drawings. However, the embodiments can be implemented with various modes. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as "first", "second", and "third" are used in order to avoid confusion among components. Thus, the terms do not limit the number or order of components. In the present specification and the like, a "first" component in one embodiment can be referred to as a "second" component in other embodiments or claims. In the present specification and the like, a "first" component in one embodiment can be referred to without the ordinal number in other embodiments or claims.

In the drawings, the same components, components having similar functions, components formed of the same material, or components formed at the same time are denoted by the same reference numerals in some cases, and the description thereof is not repeated in some cases.

Embodiment 1

In this embodiment, an example of a semiconductor device having a function of a memory device is described using drawings.

Figure 1B:
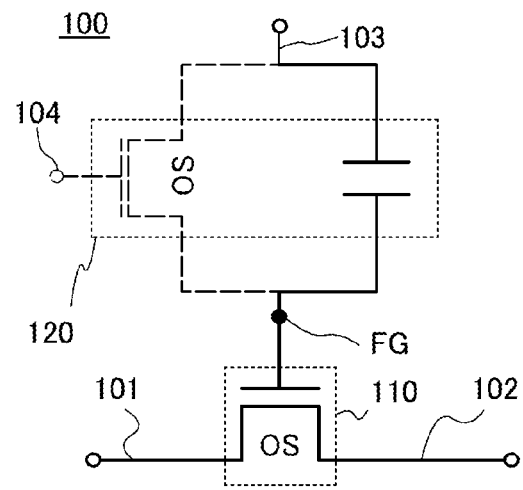

FIGS. 1A and 1B are circuit diagrams of a semiconductor device of one embodiment of the present invention which can hold stored data even when power is not supplied and which has a substantially unlimited number of write cycles.

A memory cell 100 shown in FIGS. 1A and 1B includes a first transistor 110 and a second transistor 120. A gate electrode of the first transistor 110 is connected to one of a source electrode and a drain electrode of the second transistor 120. One of a source electrode and a drain electrode of the first transistor 110 is connected to a terminal 101. The other of the source electrode and the drain electrode of the first transistor 110 is connected to a terminal 102. The other of the source electrode and the drain electrode of the second transistor 120 is connected to a terminal 103. A gate electrode of the second transistor 120 is connected to a terminal 104. In other words, the memory cell 100 includes the terminals 101, 102, 103, and 104.

As the first transistor 110, any of a variety of field effect transistors such as a Si transistor and an OS transistor can be used. As the second transistor 120, a transistor having an extremely low off-state current can be used. For example, an OS transistor is suitable.

FIG. 1A schematically shows that the second transistor 120 is turned on to charge carriers from the terminal 103 to a floating gate (FG). FIG. 1B schematically shows that the second transistor 120 is turned off to serve as a capacitor. Note that details will be described later.

Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification.

Figure 1C:
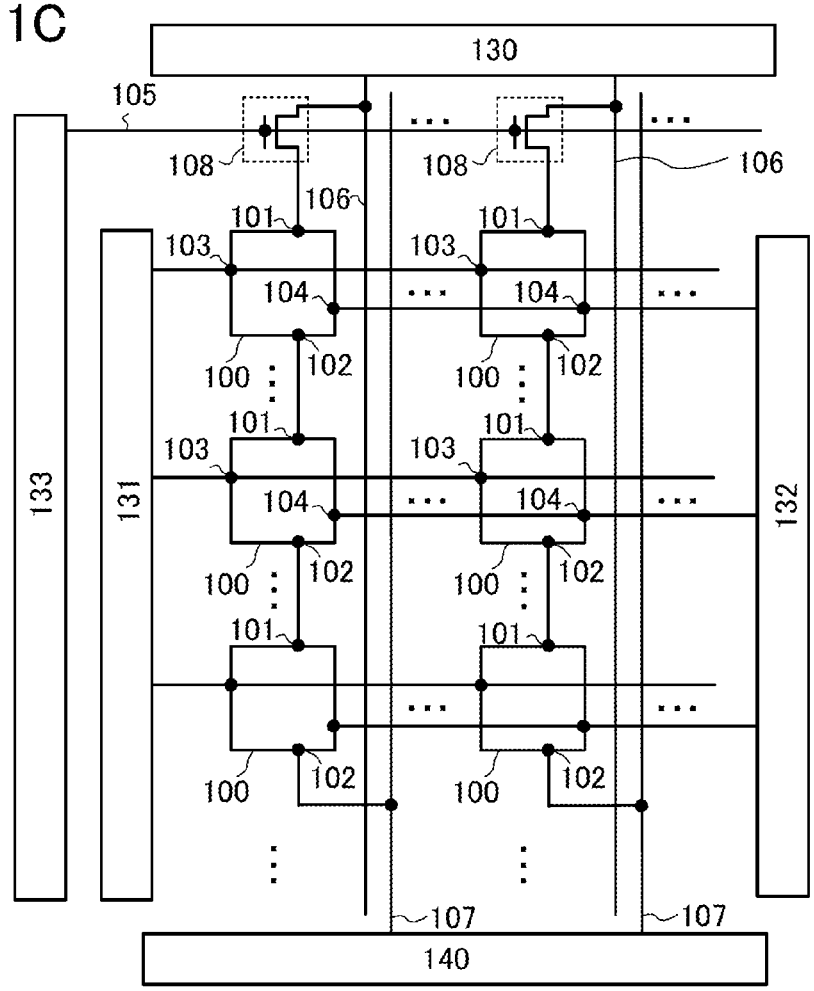

FIG. 1C shows an example of a circuit diagram of a semiconductor device formed using a plurality of the memory cells 100 in FIGS. 1A and 1B. A memory cell in which the plurality of memory cells 100 are arranged in a matrix, a driver 130, a driver 131, a driver 132, a driver 133, a driver 140, and a plurality of wirings 106 connected to the driver 130 are shown in the circuit diagram of FIG. 1C.

The wiring 106 is connected to a selection transistor 108. First to n-th (n is an integer) memory cells 100 are arranged in order from the closest to the selection transistor 108. The selection transistor 108 is connected to the first-stage memory cell 100 at the terminal 101. The memory cells 100 in adjacent stages are connected to each other. It is assumed for convenience that the terminal 101 is electrically connected to the drain electrode of the first transistor 110, and the terminal 102 is electrically connected to a source electrode of the first transistor 110. Here, the drain electrodes and source electrodes of the first transistors 110 in the first to n-th memory cells 100 are connected in series, so that a string of the memory cells 100 (hereinafter simply referred to as a string) is formed. The selection transistor 108 in each string is connected to a wiring 105 and the wiring 106. In each string, the terminal 102 of the n-th-stage memory cell 100 is connected to the driver 140 through a wiring 107.

Each of the memory cells 100 is connected to the driver 131 at the terminal 103. In addition, each of the memory cells 100 is connected to the driver 132 at the terminal 104. A gate electrode of each of the selection transistors 108 is connected to the driver 133 through the wiring 105. Thus, the operation of the memory cells 100 can be controlled with the driver 130, the driver 131, the driver 132, the driver 133, and the driver 140.

Wirings which connect the driver 131 and the memory cells 100 through the terminals 103 are referred to as word lines. Wirings which connect the driver 132 and the memory cells 100 through the terminals 104 are referred to as rewriting gate lines or simply as signal lines. The wiring 105 connecting the driver 133 with the plurality of selection transistors 108 is referred to as a string selection line. The wirings 106 connecting the driver 130 with the drain-electrode sides of a plurality of strings are referred to as bit lines. The wirings 107 connecting the driver 140 with the source-electrode sides of a plurality of strings are referred to as source lines.

Figure 2A:
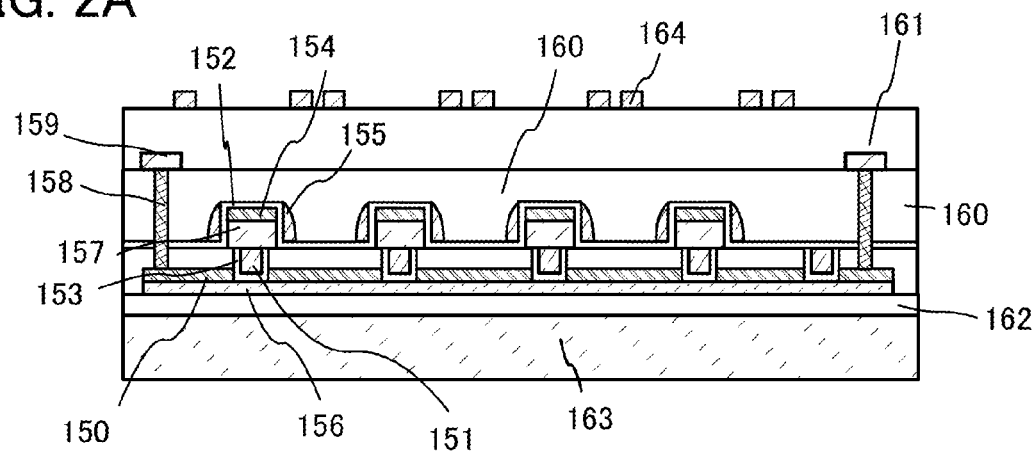
FIGS. 2A and 2B are a cross-sectional view and a top view for illustrating a semiconductor device.

FIG. 2A is a cross-sectional view of a fabricated element including the circuit shown in FIG. 1C. The element shown in FIGS. 2A and 2B includes an electrode 150, a gate electrode 151, a gate insulating film 152, a gate insulating film 153, an electrode 154, a gate electrode 155, an active layer 156, an active layer 157, a plug 158, a wiring 159, an interlayer film 160, an interlayer film 161, a base film 162, a substrate 163, and a wiring 164. Details thereof such as fabrication processes and materials will be described later.

Figure 2B:
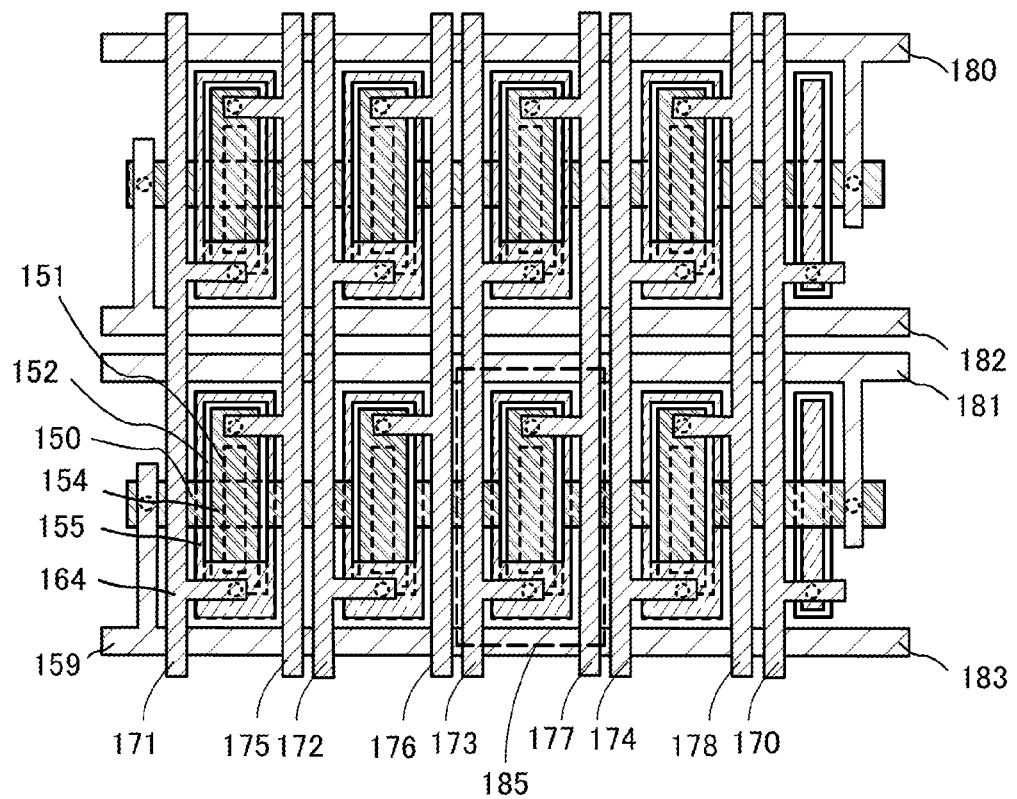

FIG. 2B is a plan view of FIG. 2A. In FIG. 2B, the plurality of memory cells 100 are arranged in a matrix. The wirings connected to the memory cells 100 are separately described in FIG. 2B, in addition to the components shown in FIG. 2A. In other words, the following wirings each corresponding to the wiring 164 are shown: a string selection line 170, a rewriting gate line 171 connected to a plurality of gate electrodes 155, a rewriting gate line 172 connected to a plurality of gate electrodes 155, a rewriting gate line 173 connected to a plurality of gate electrodes 155, a rewriting gate line 174 connected to a plurality of gate electrodes 155, a word line 175 connected to a plurality of gate electrodes 151, a word line 176 connected to a plurality of gate electrodes 151, a word line 177 connected to a plurality of gate electrodes 151, and a word line 178 connected to a plurality of gate electrodes 151. In addition, a bit line 180, a bit line 181, a source line 182, a source line 183 are shown, each of which corresponds to the wiring 159. A cell 185 represented by the dashed line corresponds to one of the memory cells 100. The cells 185 are arranged in a matrix.

The terminal 101 or 102 of the transistor 110 shown in FIG. 1A corresponds to the electrode 150 in the structure shown in FIG. 2A. The electrode 150 functions as the source electrode or drain electrode of the first transistor 110. The FG in FIG. 1A corresponds to the gate electrode 151 in FIG. 2A. The terminals 103 in FIGS. 1A to 1C correspond to the word lines 175, 176, 177, and 178 electrically connected to the electrodes 154 in the structure shown in FIG. 2B. The terminals 104 in FIGS. 1A to 1C correspond to the rewriting gate lines 171, 172, 173, and 174 electrically connected to the gate electrodes 155 in the structure shown in FIG. 2B. The wiring 105 in FIG. 1C corresponds to the string selection line 170 in FIG. 2B. The wirings 106 in FIG. 1C correspond to the bit wiring 180 and the bit wiring 181 in FIG. 2B. The wirings 107 in FIG. 1C correspond to the source lines 182 and 183 in the structure shown in FIG. 2B. A control gate of the memory cell is formed of the electrode 154 in memory reading. The electrode 154 serves as an electrode performing carrier injection and release in memory writing and erasing. Note that the memory reading, writing, and erasing are described in detail later.

FIGS. 2A and 2B show an achievable example of a structure shown in FIG. 1C. A circuit having such a structure can be referred to as a circuit to which a NAND circuit is applied from the following characteristics: the memory cells 100 are connected in series, and the selection transistors 108 at the ends of the strings are selected for data writing. Thus, such a structure is effective in high integration owing to the small area per bit as compared to a circuit to which a NOR circuit is applied. Although the selection transistor 108 is provided on the drain-electrode side of a memory cell 100 at the end of the string in FIG. 1C, the selection transistor may be provided on the source electrode side as well.

Figures 3A, 3B:
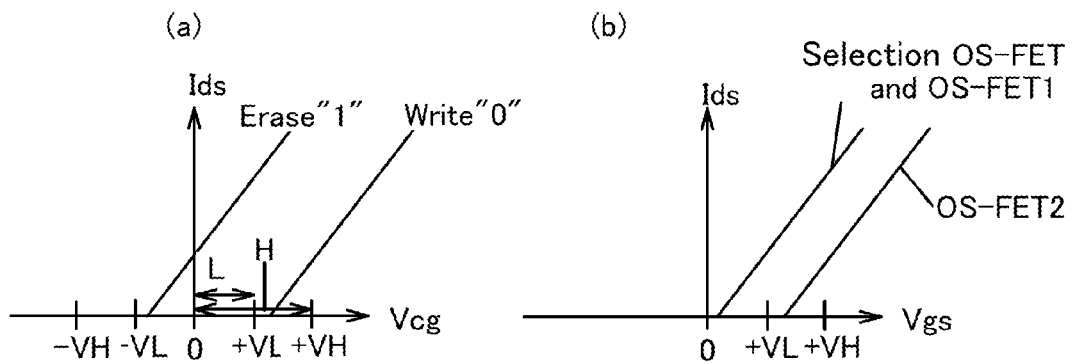
FIGS. 3A and 3B show operation of a semiconductor device.

Operations of writing and reading will be described. FIG. 3A($a$) shows Ids–Vcg (drain current–control gate voltage) characteristics of the memory cell 100 in the circuit of FIG. 1C. Similarly, FIG. 3A($b$) shows Ids–Vgs (drain current–gate voltage) characteristics for each field-effect transistor (FET) of the selection transistor 108, the first transistor 110, and the second transistor 120. In the erase operation of NAND, the Ids–Vcg characteristics are negatively shifted since the Ids–Vcg characteristics have to be normally-on This can be achieved not by making the FET itself normally on but by extracting electrons in a particular gate electrode 151 serving as a floating gate. Alternatively, the Ids–Vgs characteristics of the first transistor 110 may be normally-on in the fabrication process. Note that data writing, erasing, and reading can be performed per page that is composed of a plurality of memory cells 100 sharing a word line.

FIG. 3B shows examples of voltages applied in reading and rewriting of the cell 185 in FIG. 2B. The expressions "–H", "–L", "+L", "+H", and the like in FIG. 3B indicate voltages shown in FIGS. 3A$a$ and 3A$b$. Note that voltages applied to a gate, a source, and a drain of each FET in data reading and rewriting are changed depending on potential differences between wirings. In addition, the gradation of voltages H and L in FIG. 3B can make a multivalued memory. The multivalued memory can reduce fabrication cost per bit. Since one memory cell can store multi-bits data, the chip area can be reduced with the same storage capacity. Since the number of elements formed with one substrate is increased, the fabrication cost can be reduced.

Figures 19A, 19B:
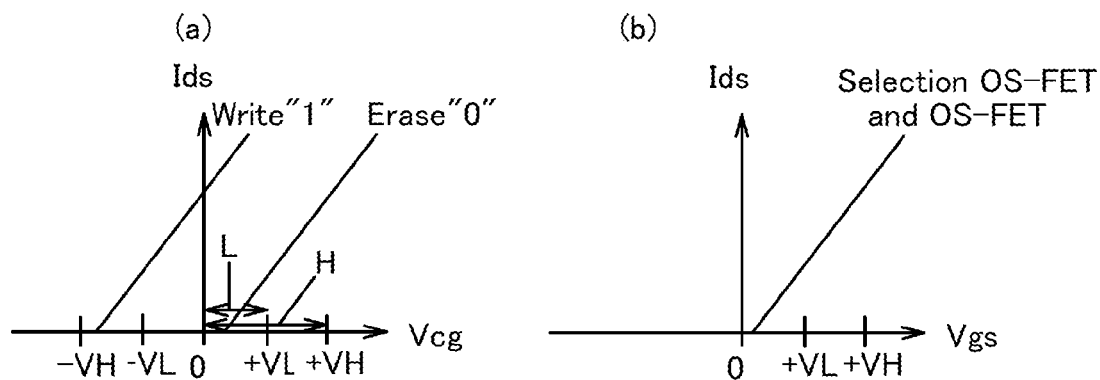
FIGS. 19A and 19B illustrate operations of a semiconductor device.

As shown in FIG. 19A($a$), the Ids–Vcg characteristics of the memory cell 100 may be set normally-on in the writing state. In that case, each FET has the Ids–Vgs characteristics shown in FIG. 19A($b$), and FIG. 19B shows examples of voltages applied in data rewriting. Note that as in FIG. 3B, voltages applied to a gate, a source, and a drain of each FET in data reading and rewriting are changed depending on potential differences between wirings. In addition, the gradation of voltages H and L in FIG. 19B can make a multivalued memory.

Note that the tables in FIG. 3B and FIG. 19B are examples of a method for driving memory cells and thus one embodiment of present invention is not limited to the method for driving memory cells shown in FIG. 3B or FIG. 19B.

The driver 130, the driver 131, the driver 132, the driver 133, and the driver 140 may each include a decoder.

In FIG. 1C, the memory cells 100 and the selection transistors 108 are electrically connected to the drivers 130, 131, 132, 133, and 140 through the wirings. However, the disclosed invention is not limited thereto. For example, the memory cells 100 may be electrically connected to the drivers through a plurality of wirings. A plurality of drivers (e.g., the drivers 131 and 133) may be combined with each other. A wiring from any one or more of the driver circuits is not necessarily electrically connected to any one or more of the memory cells 100.

Figure 4A:
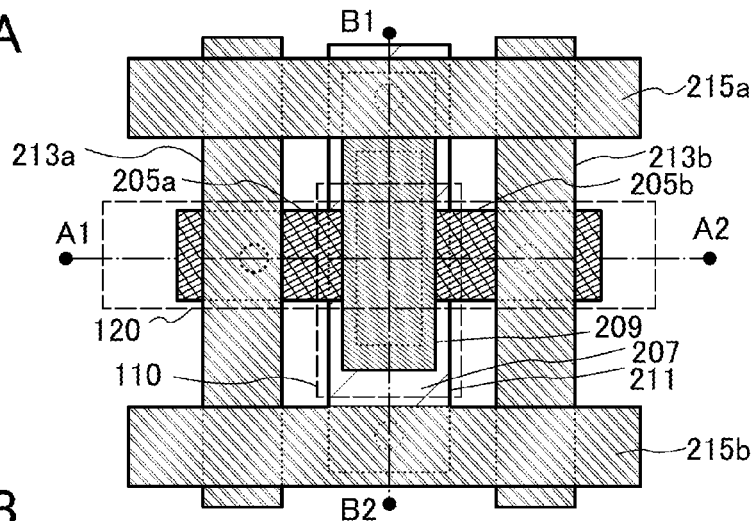
FIGS. 4A to 4C are a top view and cross-sectional views for illustrating a semiconductor device.

FIG. 4A is a top view of the semiconductor device described with reference to FIGS. 1A to 1C, and FIGS. 4B and 4C are cross-sectional views thereof. In the following description, common components in the semiconductor device in FIGS. 1A to 4C are denoted by the same reference numerals. The relative sizes of the components of the semiconductor device are not limited to those shown in FIGS. 4A to 4C.

Figure 4B:
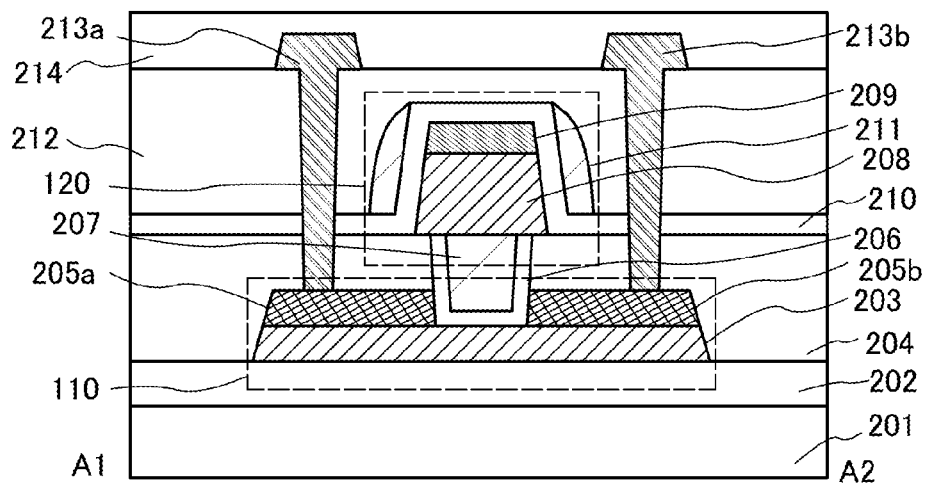

FIG. 4A is the top view, and FIG. 4B illustrates a cross section along the dash-dot line A1-A2 in FIG. 4A. Note that for simplification of the drawing, some components in the top view in FIG. 4A are not illustrated. The direction of the dash-dot line A1-A2 can be referred to as channel length direction.

Figure 4C:
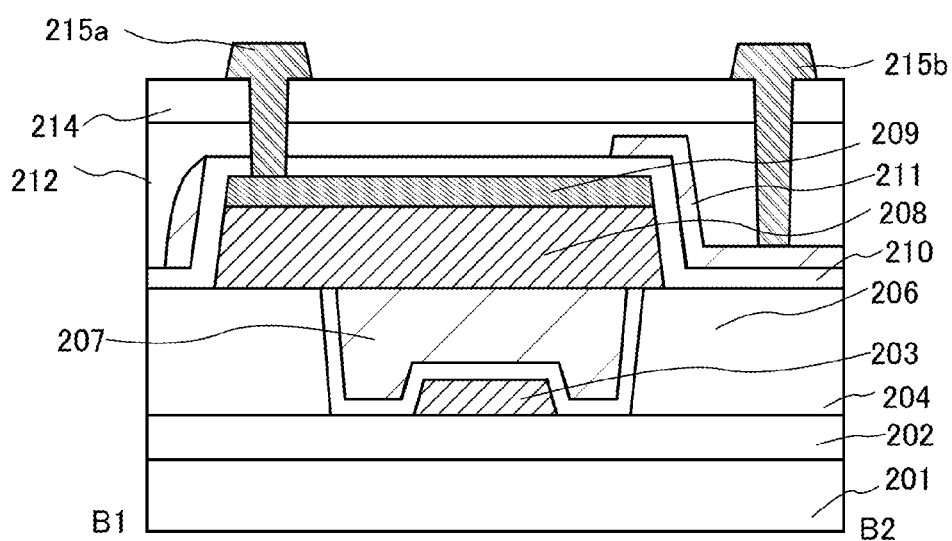

FIG. 4C illustrates a cross section along the dash-dot line B1-B2 in FIG. 4A. The direction of the dash-dot line B1-B2 can be referred to as channel width direction.

The semiconductor device shown in FIGS. 4A to 4C includes an insulating film 202 over a substrate 201, a first oxide semiconductor layer 203 over the insulating film 202, a conductive layer 205a and a conductive layer 205b over the first oxide semiconductor layer 203, a first interlayer insulating film 204 over the conductive layer 205a and the conductive layer 205b, a first gate insulating film 206 which is formed in an opening portion in the first interlayer insulating film 204 and in contact with a top surface of the first oxide semiconductor layer 203, a first gate electrode 207 over the first gate insulating film 206, a second oxide semiconductor layer 208 over the first gate electrode 207, an electrode 209 over the second oxide semiconductor layer 208, a second gate insulating film 210 over the electrode 209, a second gate electrode 211 covering at least part of a side surface of the second oxide semiconductor layer 208 with the second gate insulating film 210 interposed therebetween, a second interlayer insulating film 212 over the second gate insulating film 210 and the second gate electrode 211, a wiring 213a and a wiring 213b over the second interlayer insulating film 212, a third interlayer insulating film 214 over the wiring 213a and the wiring 213b, and a wiring 215a and a wiring 215b over the third interlayer insulating film 214.

The wiring 213a and the wiring 213b are in contact with, respectively, the conductive layer 205a and the conductive layer 205b in opening portions in the first interlayer insulating film 204, the second gate insulating film 210, and the second interlayer insulating film 212. The wiring 215a is in contact with the electrode 209 in an opening portion in the second gate insulating film 210, the second interlayer insulating film 212, and the third interlayer insulating film 214. The wiring 215b is in contact with the second gate electrode 211 in an opening portion in the second interlayer insulating film 212 and the third interlayer insulating film 214.

In the first transistor 110 described in this embodiment, a region functioning as the first gate electrode 207 is formed in a self-aligned manner so as to fill the opening portion in the first interlayer insulating film 204 and the like. Such a transistor can also be referred to as self-align s-channel FET (SA s-channel FET), trench-gate s-channel FET, or trench-gate self-align (TGSA) FET.

The first gate electrode 207 of the first transistor 110 also serves as one of the source electrode and the drain electrode of the second transistor 120. In addition, the first oxide semiconductor layer 203, the first gate electrode 207, the second oxide semiconductor layer 208, and the electrode 209 serving as the other of the source electrode and the drain electrode of the second transistor 120 are stacked. Thus, the semiconductor device can be highly integrated.

The second oxide semiconductor layer 208 and the electrode 209 are formed in one etching step with one mask, and accordingly, end portions of the layers are substantially aligned with each other, as shown in FIG. 2B.

As shown in FIG. 4C, the first gate electrode 207 is formed to electrically surround the first oxide semiconductor layer 203 in the channel width direction, so that a gate electric field is applied to the first oxide semiconductor layer 203 in the side surface direction in addition to the perpendicular direction. In other words, a gate electric field is applied to the entire first oxide semiconductor layer 203. Current flows through the entire first oxide semiconductor layer 203, leading to an increase in on-state current.

Next, components of the semiconductor device illustrated in FIGS. 4A to 4C are described in detail.

The substrate 201 is not limited to a simple supporting substrate, and may be a substrate where another device such as a transistor is formed. In that case, at least one of the first gate electrode 207, the conductive layer 205a, and the conductive layer 205b may be electrically connected to the above-described device.

The insulating film 202 can have a function of supplying oxygen to the first oxide semiconductor layer 203 as well as a function of preventing diffusion of impurities from the substrate 201. For this reason, the insulating film 202 is preferably an insulating film containing oxygen and further preferably an insulating film containing oxygen in which the oxygen content is higher than that in the stoichiometric composition. In the case where the substrate 201 is provided with another device as described above, the insulating film 202 also has a function as an interlayer insulating film. In that case, the insulating film 202 is preferably subjected to planarization treatment such as chemical mechanical polishing (CMP) treatment so as to have a flat surface.

The first oxide semiconductor layer 203 and the second oxide semiconductor layer 208 may include a crystalline layer in which c-axes are aligned in the direction perpendicular to a surface of the insulating film 202.

The thicknesses of the first oxide semiconductor layer 203 and the second oxide semiconductor layer 208 are each greater than or equal to 1 nm and less than or equal to 200 nm, preferably greater than or equal to 3 nm and less than or equal to 60 nm.

For the first oxide semiconductor layer 203 and the second oxide semiconductor layer 208, for example, an In—Ga—Zn oxide whose atomic ratio of In to Ga and Zn is 1:1:1, 5:5:6, 3:1:2, or the like can be used. The first oxide semiconductor layer 203 and the second oxide semiconductor layer 208 may be formed using the same material or different materials and may be stacked oxide semiconductor layers.

Note that stable electrical characteristics can be effectively imparted to a transistor in which an oxide semiconductor layer serves as a channel by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1\times10^{17}/cm^3$, preferably lower than $1\times10^{15}/cm^3$, further preferably lower than $1\times10^{13}/cm^3$, still further preferably lower than $1\times10^{8}/cm^3$ and higher than or equal to $1\times10^{-9}/cm^3$.

In the oxide semiconductor layer, hydrogen, nitrogen, carbon, silicon, and a metal element other than a main component are impurities. For example, hydrogen and nitrogen form donor levels to increase the carrier density, and silicon forms impurity levels in the oxide semiconductor layer. The impurity level becomes a trap, which might cause deterioration of the electrical characteristics of the transistor. Therefore, the concentration of the impurities at an interface between the first oxide semiconductor layer 203 and the second oxide semiconductor layer 208 is preferably reduced.

In order to make the oxide semiconductor layer intrinsic or substantially intrinsic, in SIMS (secondary ion mass spectrometry), for example, the concentration of silicon at a certain depth of the oxide semiconductor layer or in a region of the oxide semiconductor layer is lower than $1\times10^{19}$ atoms/$cm^3$, preferably lower than $5\times10^{18}$ atoms/$cm^3$, more preferably lower than $1\times10^{18}$ atoms/$cm^3$. Furthermore, the concentration of hydrogen at a certain depth of the oxide semiconductor layer or in a region of the oxide semiconductor layer is lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/cm$^3$. Furthermore, the concentration of nitrogen at a certain depth of the oxide semiconductor layer or in a region of the oxide semiconductor layer is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In addition, in the case where the oxide semiconductor layer includes a crystal, the crystallinity of the oxide semiconductor layer might be decreased if silicon or carbon is included at high concentration. In order not to lower the crystallinity of the oxide semiconductor layer, for example, the concentration of silicon at a certain depth of the oxide semiconductor layer or in a certain region of the oxide semiconductor layer is lower than $1\times10^{19}$ atoms/cm$^3$, preferably lower than $5\times10^{18}$ atoms/cm$^3$, further preferably lower than $1\times10^{18}$ atoms/cm$^3$. Furthermore, the concentration of carbon at a certain depth of the oxide semiconductor layer or in a certain region of the oxide semiconductor layer is lower than $1\times10^{19}$ atoms/cm$^3$, preferably lower than $5\times10^{18}$ atoms/cm$^3$, further preferably lower than $1\times10^{18}$ atoms/cm$^3$, for example.

A transistor in which a highly purified oxide semiconductor film is used for the channel formation region as described above has an extremely low off-state current. In the case where the voltage between the source and the drain is set to approximately 0.1 V, 5 V, or 10 V, for example, the off-state current standardized on the channel width of the transistor can be as low as several yoctoamperes per micrometer to several zeptoamperes per micrometer.

For the conductive layer 205a and the conductive layer 205b, a conductive material that is easily bonded to oxygen is preferably used. For example, Al, Cr, Cu, Ta, Ti, Mo, or W can be used. A single-layer structure or multi-layer structure including a film containing any of these materials can be used. Among the materials, in particular, it is preferable to use Ti, which is particularly easily bonded to oxygen, or W, which has a high melting point and thus makes subsequent process temperatures comparatively high. Note that the conductive material that is easily bonded to oxygen includes, in its category, a material to which oxygen is easily diffused.

When the conductive material that is easily bonded to oxygen is in contact with an oxide semiconductor layer, a phenomenon occurs in which oxygen in the oxide semiconductor layer is diffused to the conductive material that is easily bonded to oxygen. The phenomenon noticeably occurs when the temperature is high. Since the manufacturing process of the transistor involves a heat treatment step, the above phenomenon causes generation of oxygen vacancies in the vicinity of a region which is in the oxide semiconductor layer and is in contact with the source electrode layer or the drain electrode layer. Hydrogen slightly contained in the layer and the oxygen vacancies are bonded to each other, whereby the region is markedly changed to an n-type region. Accordingly, the n-type regions can serve as a source or a drain region of the transistor.

In the case of forming a transistor with an extremely short channel length, an n-type region which is formed by the generation of oxygen vacancies might extend in the channel length direction of the transistor. In that case, the electrical characteristics of the transistor change; for example, the threshold voltage is shifted, or on and off states of the transistor is difficult to control with the gate voltage (in which case the transistor is turned on). Accordingly, when a transistor with an extremely short channel length is formed, it is not always preferable that a conductive material that can be bonded to oxygen be used for a source electrode layer and a drain electrode layer.

In such a case, a conductive material that is less likely to be bonded to oxygen than the above material can be used for the conductive layer 205a and the conductive layer 205b. As such a conductive material, for example, a material containing tantalum nitride, titanium nitride, gold, platinum, palladium, or ruthenium can be used. Note that the conductive material may be stacked with the above-described conductive material that is easily bonded to oxygen.

The first gate insulating film 206 and the second gate insulating film 210 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The first gate insulating film 206 and the second gate insulating film 210 may be formed using the same material or different materials. The first gate insulating film 206 and the second gate insulating film 210 may be a stack of any of the above materials.

For the first gate electrode 207 and the second gate electrode 211, a conductive film formed of Al, Ti, Cr, Co, Ni, Cu, Y, Zr, Mo, Ru, Ag, Ta, W, or the like can be used. The first gate electrode 207 and the second gate electrode 211 may be formed using the same material or different materials. The first gate electrode 207 and the second gate electrode 211 may be a stack of any of the above materials or may be formed using a conductive film containing nitrogen.

For the first interlayer insulating film 204, the second interlayer insulating film 212, and the third interlayer insulating film, an oxide such as silicon oxide or aluminum oxide can be used. Alternatively, when silicon nitride, aluminum nitride, silicon oxynitride, or aluminum oxynitride is stacked over silicon oxide or aluminum oxide, the function as a protective film can be enhanced. The first interlayer insulating film 204, the second interlayer insulating film 212, and the third interlayer insulating film may be formed using the same material or different materials. The first interlayer insulating film 204, the second interlayer insulating film 212, and the third interlayer insulating film may be a stack of any of the above materials.

The wiring 213a, the wiring 213b, the wiring 215a, and the wiring 215b are each formed to have a single-layer structure or a stacked-layer structure using any of metals such as aluminum, titanium, chromium, nickel, copper, yttrium, zirconium, molybdenum, silver, tantalum, and tungsten, or an alloy containing any of these metals as a main component. The wiring 213a, the wiring 213b, the wiring 215a, and the wiring 215b may be formed using the same material or different materials.

In the semiconductor device of this embodiment as a memory device, writing is performed as follows: a voltage is applied to the second gate electrode 211 to bring the electrode 209 and the first gate electrode 207 into electrical contact with each other through the second oxide semiconductor layer 208; equal voltages are applied to the conductive layer 205a and the conductive layer 205b; and a voltage lower or higher than the equal voltages is applied to the electrode 209 to charge carrier to the first gate electrode 207.

In this memory device, reading is performed as follows. The voltage of the second gate electrode 211 is set to 0 V or to a voltage at which the off-state current of the second transistor 120 is sufficiently reduced (to 1 zA or less, for example) to break the electrical contact between the electrode 209 and the first gate electrode 207. Then, when a voltage is applied to the electrode 209, the voltage can be applied to the first gate electrode 207 and the channel in the first transistor 110 because the first gate electrode 207 and the electrode 209 are capacitively coupled through the second oxide semiconductor layer 208. Thus, the electrode 209 functions as a control gate, and the second oxide semiconductor layer 208 functions as a dielectric.

At this time, the apparent threshold voltage of the first transistor 110 (the first oxide semiconductor layer 203) depends on the amount of the charge in the first gate electrode 207 functioning as a floating gate. The voltage or current between the source and the drain of the first transistor 110 (the first oxide semiconductor layer 203) is changed due to the change in threshold voltage. Therefore, the amount of change is detected for determining the amount of the charge in the first gate electrode 207 (i.e., written data).

Since the off-state current of the transistor in which an oxide semiconductor film is used for the channel formation region is extremely low as described above, the electrical charge in the first gate electrode 207 functioning as a floating gate through the second transistor 120 does not leak much, so that the data can be held. As described above, the semiconductor of this embodiment can be used as a memory device.

In the memory device, the control gate and the floating gate are capacitively coupled through the second oxide semiconductor layer 208, although they are capacitively coupled through a gate insulating film therebetween or the like in a conventional flash memory or the like. For example, in the case where indium gallium zinc oxide (IGZO) is used for the second oxide semiconductor layer 208, since the dielectric constant (approximately 15) of IGZO is higher than the dielectric constant (approximately 4) of silicon oxide, which is mainly used for the gate insulating film, a reduction in capacitor area can be achieved due to the high dielectric constant of the capacitor, although depending on the thickness of the second oxide semiconductor layer 208.

In this embodiment, one embodiment of the present invention is described. Other embodiments of the present invention are described in other embodiments. Note that one embodiment of the present invention is not limited thereto. That is, since various embodiments of the present invention are disclosed in this embodiment and the other embodiments, one embodiment of the present invention is not limited to a specific embodiment. For example, an example in which a channel formation region, source and drain regions, and the like of a transistor include an oxide semiconductor is described as one embodiment of the present invention; however, one embodiment of the present invention is not limited to this example. Depending on circumstances or conditions, various transistors or a channel formation region, a source region, a drain region, or the like of a transistor in one embodiment of the present invention may include various semiconductors. Depending on circumstances or conditions, for example, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, a source region or a drain region of a transistor, or the like of one embodiment of the present invention. Alternatively, for example, depending on circumstances or conditions, various transistors or a channel formation region, a source region, a drain region, or the like of a transistor in one embodiment of the present invention does not necessarily include an oxide semiconductor.

This embodiment can be combined with any of the other embodiments in this specification as appropriate.

Embodiment 2

In this embodiment, a method of manufacturing the semiconductor device described in Embodiment 1 is described with reference to FIGS. 5A to 5C to FIGS. 10A and 10B.

For the substrate 201, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium, a silicon-on-insulator (SOI) substrate, or the like can be used. Any of these substrates further provided with a semiconductor element thereover may be used.

The insulating film 202 is formed over the substrate 201. The insulating film 202 can be formed by a plasma CVD method, a sputtering method, or the like using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a film in which any of the above materials are mixed. Alternatively, a stack including any of the above materials can be used, and at least an upper layer in contact with the first oxide semiconductor layer 203 is preferably formed using a material containing excess oxygen which can serve as a supply source of oxygen to the first oxide semiconductor layer 203.

Oxygen may be added to the insulating film 202 by an ion implantation method, an ion doping method, a plasma immersion ion implantation method, or the like. Adding oxygen enables the insulating film 202 to supply oxygen much easily to the first oxide semiconductor layer 203.

In the case where a surface of the substrate 201 is made of an insulator and there is no influence of impurity diffusion to the first oxide semiconductor layer 203 to be formed later, the insulating film 202 is not necessarily provided.

Next, an oxide semiconductor film 303 to be the first oxide semiconductor layer 203 is deposited over the insulating film 202 by a sputtering method, a CVD method, an MBE method, an ALD method, or a PLD method.

An oxide semiconductor that can be used for the first oxide semiconductor layer preferably contains at least indium (In) or zinc (Zn). Both In and Zn are preferably contained. Furthermore, in order to reduce variations in the electrical characteristics of the transistor including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, an In—Zn oxide, a Sn—Zn oxide, an Al—Zn oxide, an Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, the term "In—Ga—Zn oxide" means an oxide containing In, Ga, and Zn as its main components. The In—Ga—Zn oxide may contain another metal element in addition to In, Ga, and Zn. Note that in this specification, a film containing the In—Ga—Zn oxide is also referred to as IGZO film.

Alternatively, a material represented by $InMO_3(ZnO)_m$ (m>0 is satisfied, and m is not an integer) may be used. Note that M represents one or more metal elements selected from Ga, Y, Zr, La, Ce, and Nd. A material represented by $In_2SnO_5(ZnO)_n$ (n>0, n is an integer) may be used.

Note that the oxide semiconductor film is preferably formed by a sputtering method. As a sputtering method, an RF sputtering method, a DC sputtering method, an AC sputtering method, or the like can be used.

In the case where an In—Ga—Zn oxide is used for the first oxide semiconductor layer 203, a material whose atomic ratio of In to Ga and Zn is any of 1:1:1, 2:2:1, 2:2:3, 3:1:2, 5:5:6, 1:3:2, 1:3:3, 1:3:4, 1:3:6, 1:4:3, 1:5:4, 1:6:6, 2:1:3, 1:6:4, 1:9:6, 1:1:4, and 1:1:2 can be used.

Note that the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The structure of the oxide semiconductor film is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

A CAAC-OS film is one of oxide semiconductor films having a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

In the cross-sectional TEM image of the CAAC-OS film observed in a direction substantially parallel to the sample surface, metal atoms arranged in a layered manner are seen in the crystal parts. Each metal atom layer has a morphology reflecting unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

In contrast, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, in analysis of the CAAC-OS film by an in-plane method in which an X-ray is incident on a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. In contrast, in the case of a CAAC-OS film, a peak is not clearly observed even when φ scan is performed with 2θ fixed at around 56°.

According to the above results, in the CAAC-OS film having c-axis alignment, while the directions of a-axes and b-axes are irregularly oriented between different crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

The degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Furthermore, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak at $2\theta$ of around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element having higher strength of bonding to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic" state. A highly purified intrinsic or substantially highly purified intrinsic oxide semiconductor film has few carrier generation sources, and thus can have a low carrier density. Thus, the transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In an image obtained with a TEM, crystal parts cannot be found clearly in the microcrystalline oxide semiconductor film in some cases. In most cases, a crystal part in the microcrystalline oxide semiconductor film is greater than or equal to 1 nm and less than or equal to 100 nm, or greater than or equal to 1 nm and less than or equal to 10 nm. An oxide semiconductor film including nanocrystal (nc), which is a microcrystal with a size greater than or equal to 1 nm and less than or equal to 10 nm, or a size greater than or equal to 1 nm and less than or equal to 3 nm, is specifically referred to as nc-OS (nanocrystalline oxide semiconductor) film. In an image obtained with a TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than the diameter of a crystal part, a peak which shows a crystal plane does not appear. Furthermore, a diffraction pattern like a halo pattern appears in an electron diffraction pattern (also referred to as selected-area electron diffraction pattern) of the nc-OS film obtained by using an electron beam with a probe diameter (e.g., larger than or equal to 50 nm) larger than the diameter of a crystal part. Meanwhile, spots are observed in an electron diffraction pattern (also referred to as nanobeam electron diffraction pattern) of the nc-OS film which is obtained using an electron beam with a probe diameter (e.g., 1 nm or larger and 30 nm or smaller) close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film is likely to have a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

For example, the CAAC-OS film can be deposited by a sputtering method using a polycrystalline oxide semiconductor sputtering target. When ions collide with the sputtering target, a crystal region included in the sputtering target may be separated from the target along the a-b plane; in other words, a sputtered particle having a plane parallel to the a-b plane (flat-plate-like sputtered particle or pellet-like sputtered particle) may flake off from the sputtering target. The flat-plate-like sputtered particle or pellet-like sputtered particle is electrically charged and thus reaches the substrate while maintaining its crystal state, without being aggregation in plasma, forming a CAAC-OS film.

After the oxide semiconductor film 303 is formed, first heat treatment may be performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. The first heat treatment can increase the crystallinity of the oxide semiconductor film 303 and remove impurities such as water and hydrogen from the insulating film 202.

Figure 5A:
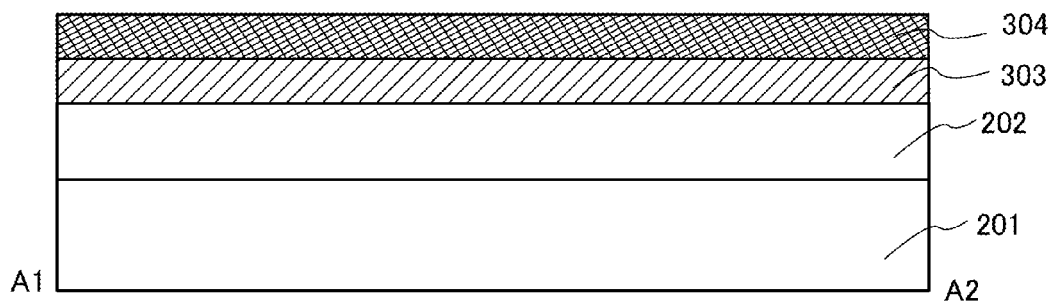
FIGS. 5A to 5C illustrate a method for manufacturing a semiconductor device.

Next, a conductive film 304 to be the conductive layers 205a and 205b is formed over the oxide semiconductor film 303 (see FIG. 5A). For the conductive film 304, any of the materials described for the conductive layers 205a and 205b can be used. For example, a 20-nm-thick titanium nitride film is formed by a sputtering method or the like. Alternatively, a tungsten film may be formed by a CVD method.

Figure 5B:
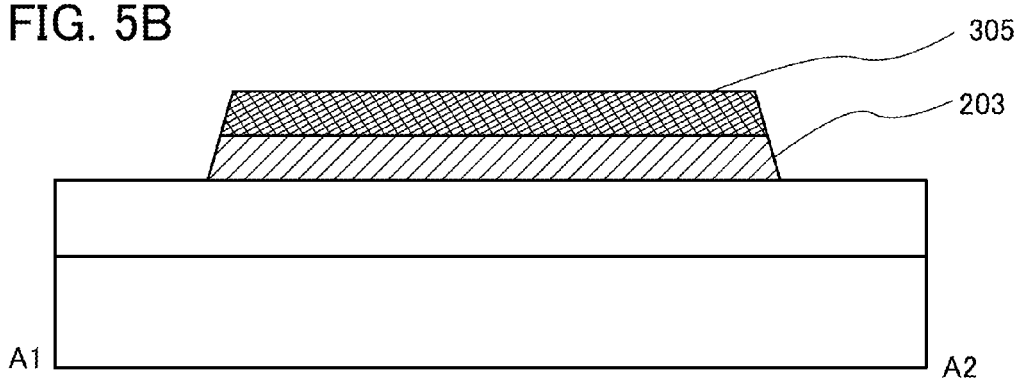

Next, the oxide semiconductor film 303 and the conductive film 304 are etched into an island shape to form the first oxide semiconductor layer 203 and a conductive layer 305 (see FIG. 5B).

Figure 5C:
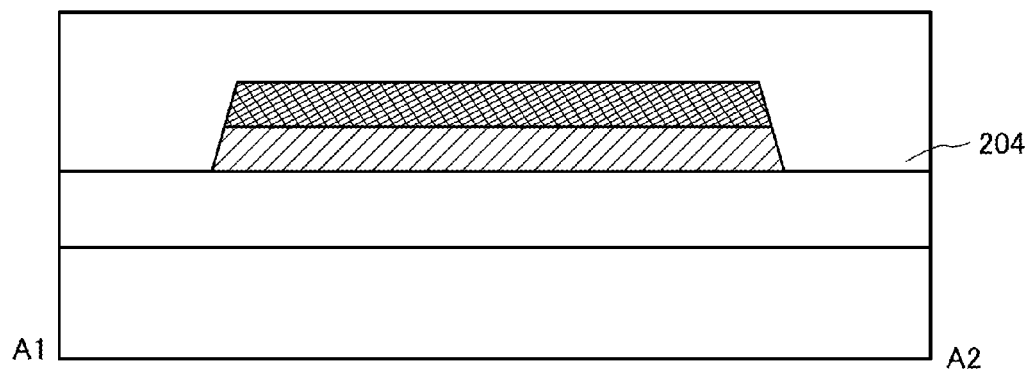

Next, the first interlayer insulating film 204 is formed over the conductive layer 305 (see FIG. 5C). For the first interlayer insulating film 204, any of the materials described for the first interlayer insulating film 204 in Embodiment 1 can be used.

Figure 6A:
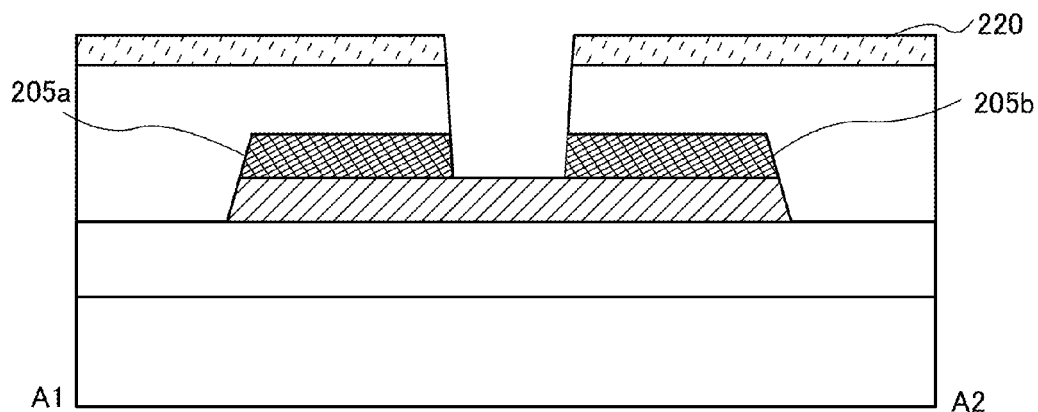
FIGS. 6A to 6C illustrate a method for manufacturing a semiconductor device.

Next, after a resist mask 220 is formed, an opening portion is formed in the first interlayer insulating film 204, and thus the conductive layer 305 is etched so as to be divided over the first oxide semiconductor layer 203 to form the conductive layer 205a and the conductive layer 205b (see FIG. 6A). At this time, the conductive layer 305 may be over-etched, in which case the first oxide semiconductor layer 203 is partly etched.

Figure 6B:
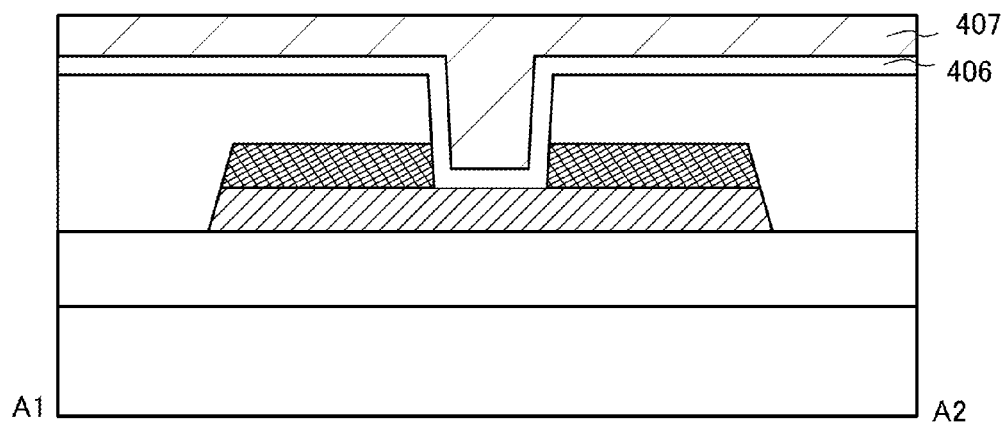

Next, over the first interlayer insulating film 204, an insulating film 406 to be the first gate insulating film 206 and a conductive film 407 to be the first gate electrode 207 are formed (see FIG. 6B). For the insulating film 406, any of the materials described for the first gate insulating film 206 in Embodiment 1 can be used. The insulating film 406 can be formed by a sputtering method, a CVD method, an MBE method, an ALD method, a PLD method, or the like. For the conductive film 407, any of the materials described for the first gate electrode 207 in Embodiment 1 can be used.

Figure 6C:
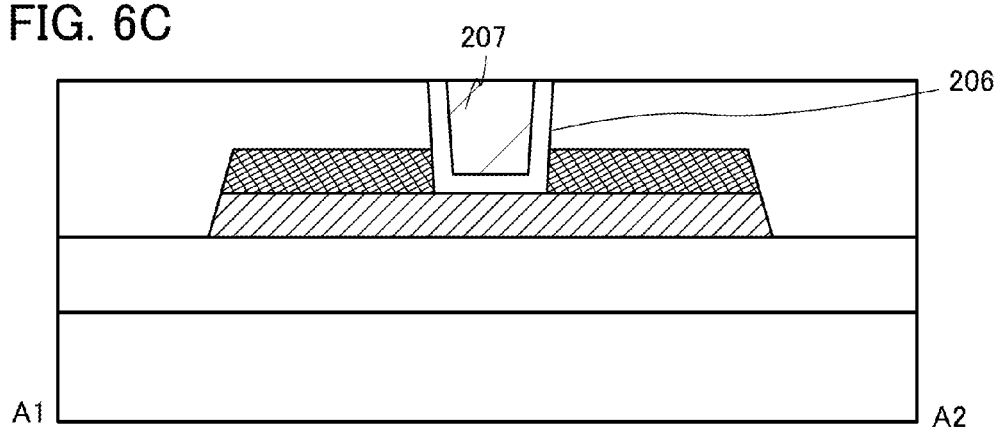

Next, the insulating film 406 and the conductive film 407 are etched by a chemical mechanical polishing (CMP) method or the like until a surface of the first interlayer insulating film 204 is exposed, whereby the first gate insulating film 206 and the first gate electrode 207 are formed (see FIG. 6C).

Figure 7A:
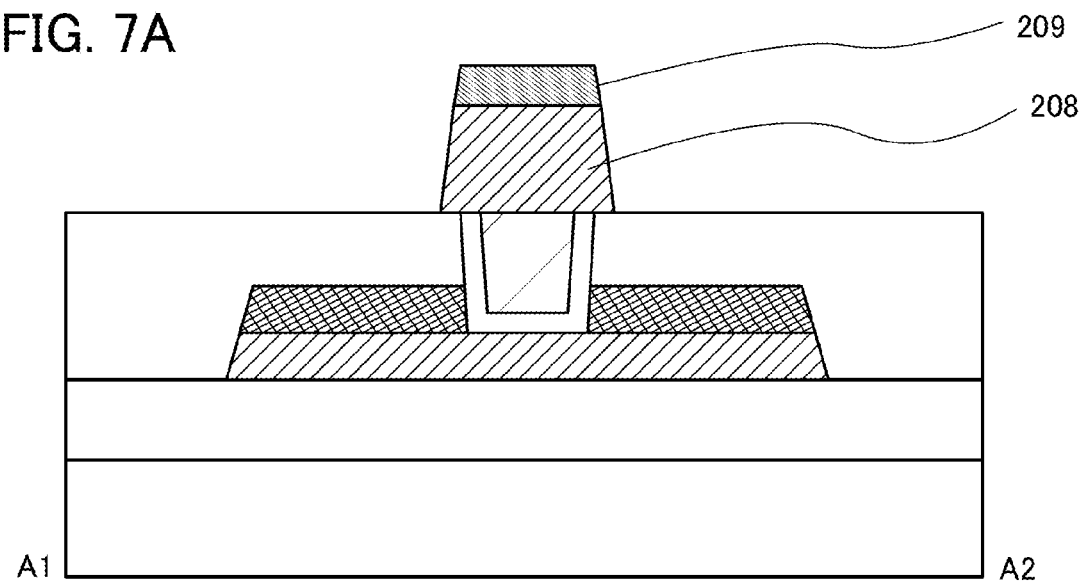
FIGS. 7A and 7B illustrate a method for manufacturing a semiconductor device.
Figure 9A:
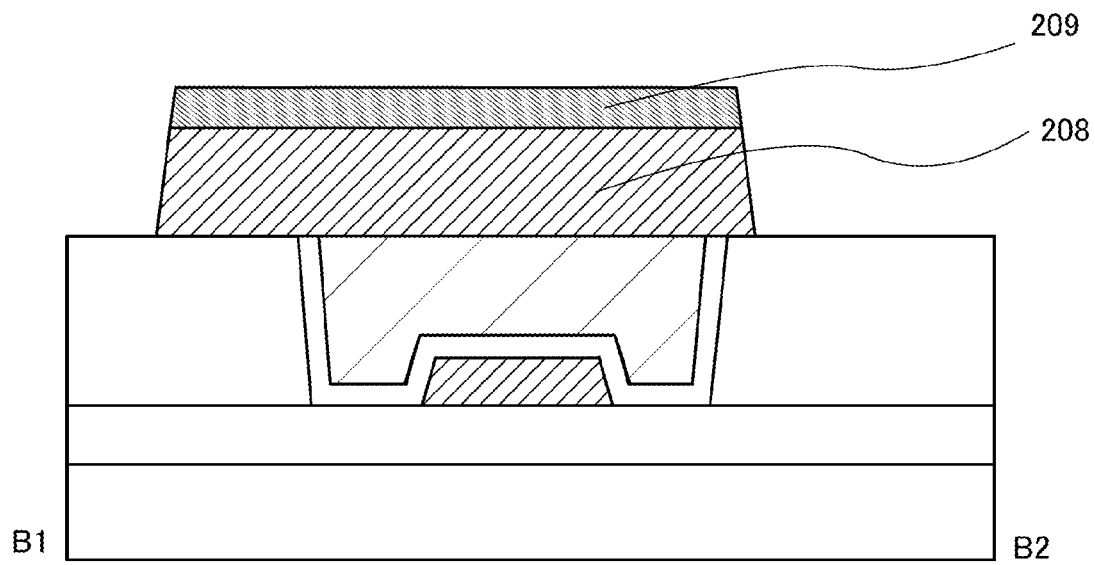
FIGS. 9A and 9B illustrate a method for manufacturing a semiconductor device.

Next, the second oxide semiconductor layer 208 and the electrode 209 are formed over the first gate electrode 207 (see FIG. 9A). A cross section of the state in FIG. 7A in the channel width direction is illustrated in FIG. 7A. For the second oxide semiconductor layer 208, a material similar to the materials described for the second oxide semiconductor layer 208 in Embodiment 1 can be used. For the electrode 209 Al, Cr, Cu, Ta, Ti, Mo, W, or an alloy material containing any of these as a main component can be used. The electrode 209 may be a stacked layer including any of the above materials.

Figure 7B:
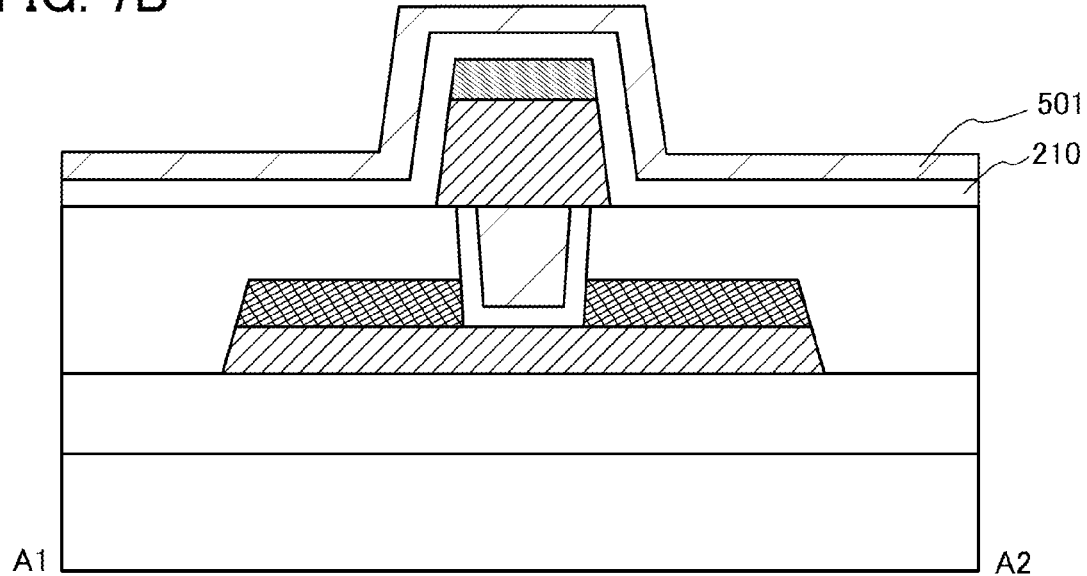
Figure 9B:
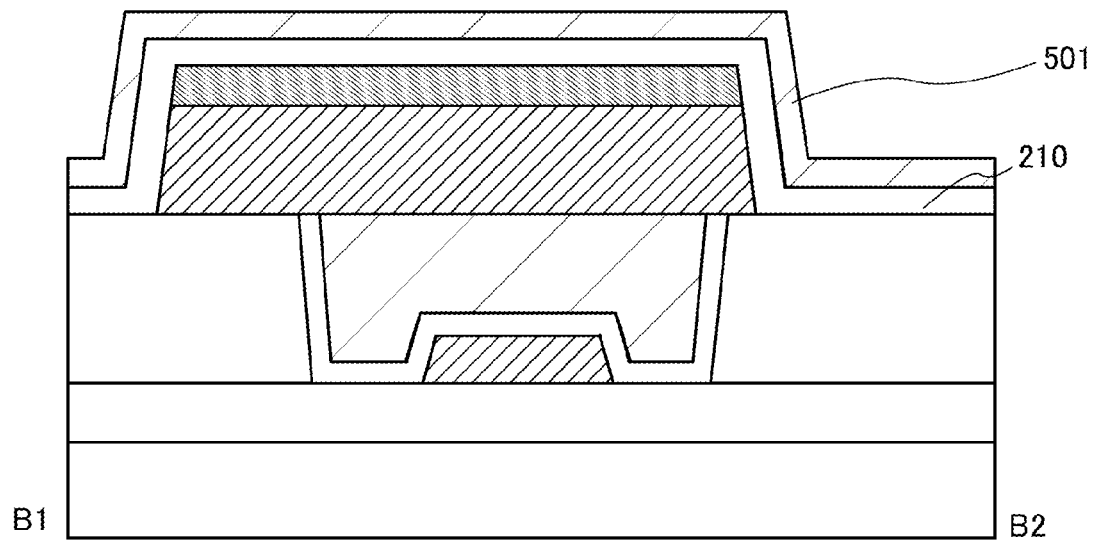

Next, the second gate insulating film 210 and a conductive film 501 are stacked in this order over the electrode 209 (see FIG. 7B). A cross section of the state in FIG. 9B in the channel width direction is illustrated in FIG. 7B. For the second gate insulating film 210, a material similar to the materials described for the second gate insulating film 210 in Embodiment 1 can be used. For the conductive film 501, a material similar to the materials described for the electrode 209 in Embodiment 1 can be used.

Since the second oxide semiconductor layer 208 and the electrode 209 are formed in one etching step with one mask, end portions of the layers are aligned with each other and the layers can be favorably covered with the second gate insulating film 210. Even if a stacked layer of the second oxide semiconductor layer 208 and the electrode 209 is thick, formation defects are less likely to be caused. Thus, higher yield in the fabrication process can be achieved.

Figure 8A:
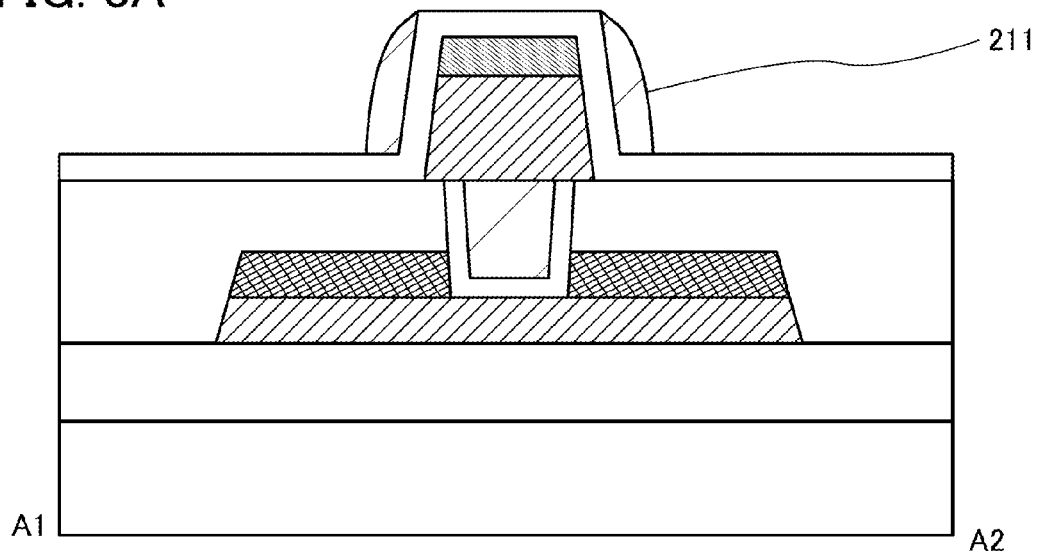
FIGS. 8A and 8B illustrate a method for manufacturing a semiconductor device.
Figure 8B:
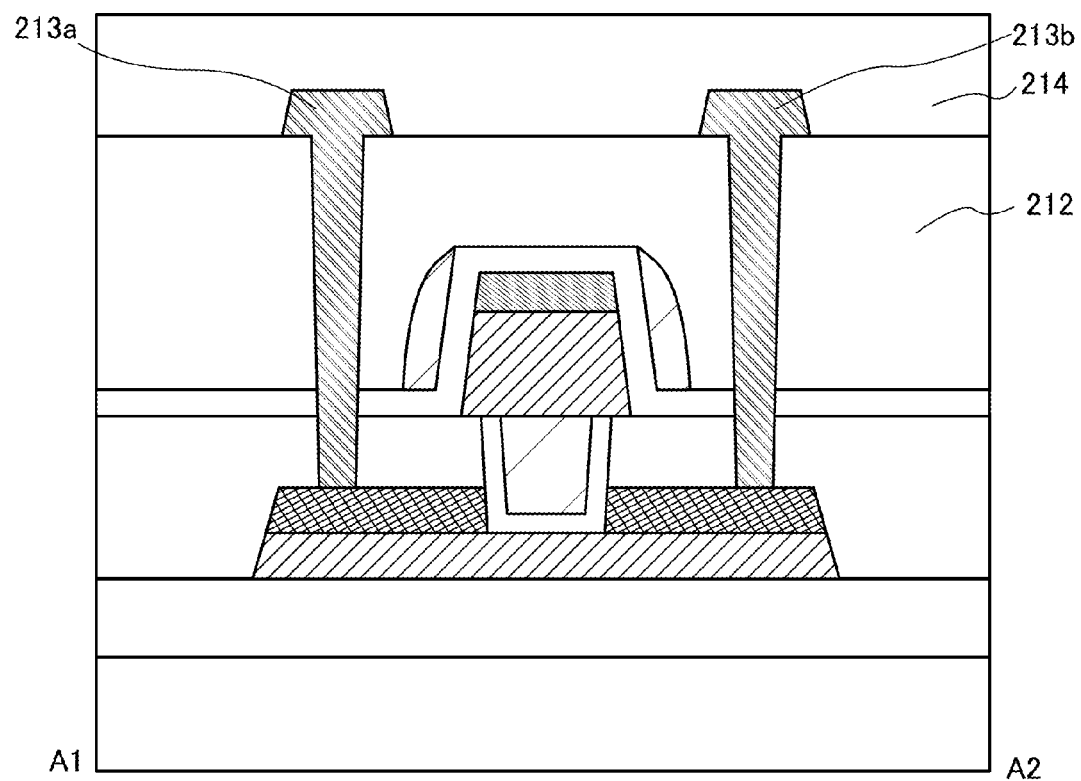
Figure 10A:
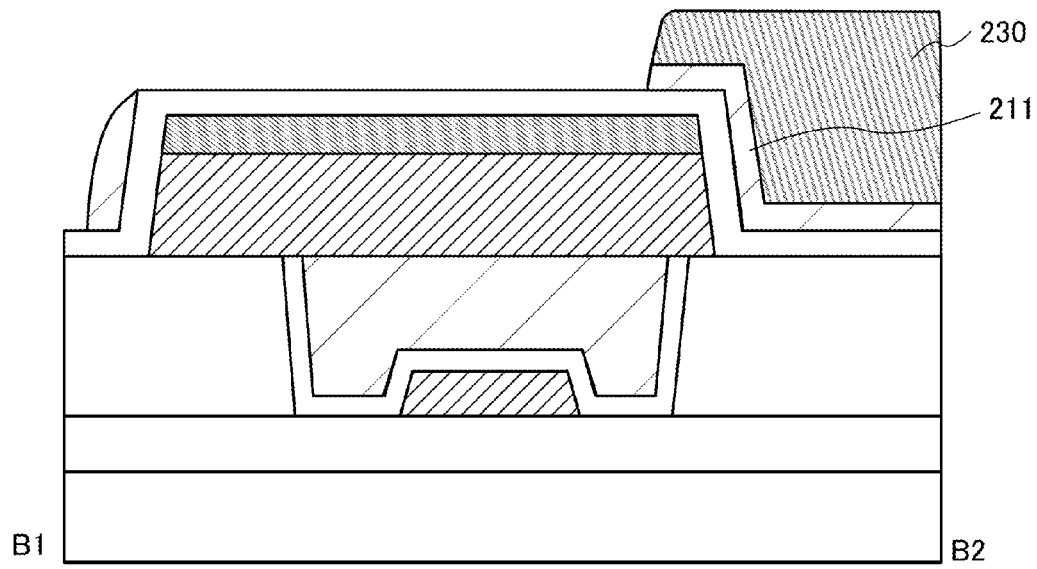
FIGS. 10A and 10B illustrate a method for manufacturing a semiconductor device.
Figure 10B:
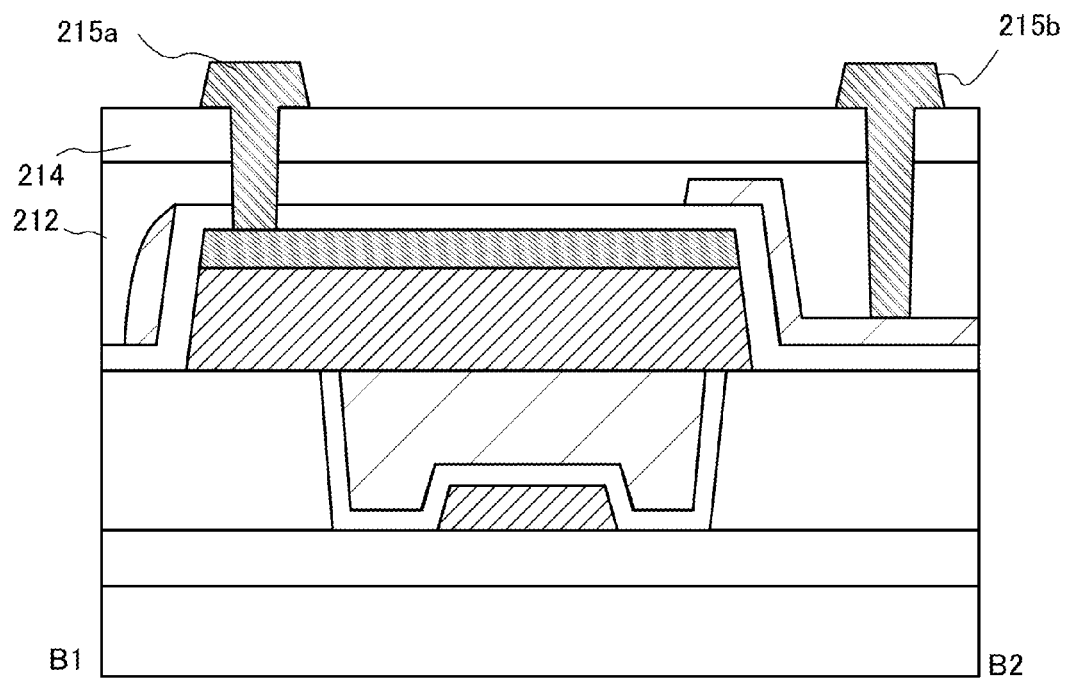

Next, after a resist mask 230 is formed, etch-back is performed to process the conductive film 501 into the second gate electrode 211 covering a side surface of the second oxide semiconductor layer 208 with the second gate insulating film 210 interposed therebetween (see FIG. 8A). A cross section of the state in FIG. 8A in the channel width direction is illustrated in FIG. 10A Next, the second interlayer insulating film 212 is formed over the second gate electrode 211. Then, opening portions are formed in the first interlayer insulating film 204, the second gate electrode 211, and the second interlayer insulating film 212. Over the second interlayer insulating film and in the opening portions, the wiring 213a and the wiring 213b are formed to be connected to the conductive layer 205a and the conductive layer 205b, respectively. Then, the third interlayer insulating film 214 is formed over the wirings 213a and 213b, and the wirings 215a and 215b are formed over the third interlayer insulating film 214 (see FIG. 8B). A cross section of the state in FIG. 10B in the channel width direction is illustrated in FIG. 8B. For the second interlayer insulating film 212 and the third interlayer insulating film 214, materials similar to those described for the second interlayer insulating film 212 and the third interlayer insulating film 214 in Embodiment 1 can be used. For the wiring 213a and the wiring 213b, materials similar to those described for the wiring 213a and the wiring 213b in Embodiment 1 can be used. For the wiring 215a and the wiring 215b, materials similar to those described for the wiring 215a and the wiring 215b in Embodiment 1 can be used.

Through the above steps, the transistors illustrated in FIGS. 4A to 4C can be manufactured.

This embodiment can be combined with any of the other embodiments in this specification as appropriate.

Embodiment 3

Figure 11A:
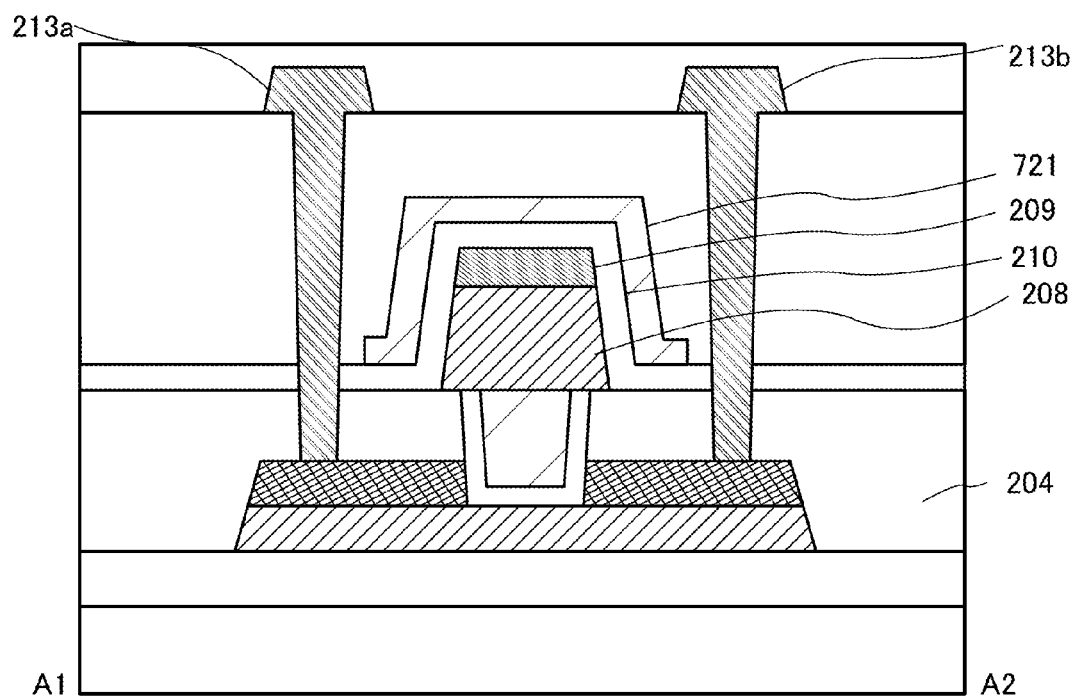
FIGS. 11A and 11B are cross-sectional views for illustrating a semiconductor device.
Figure 11B:
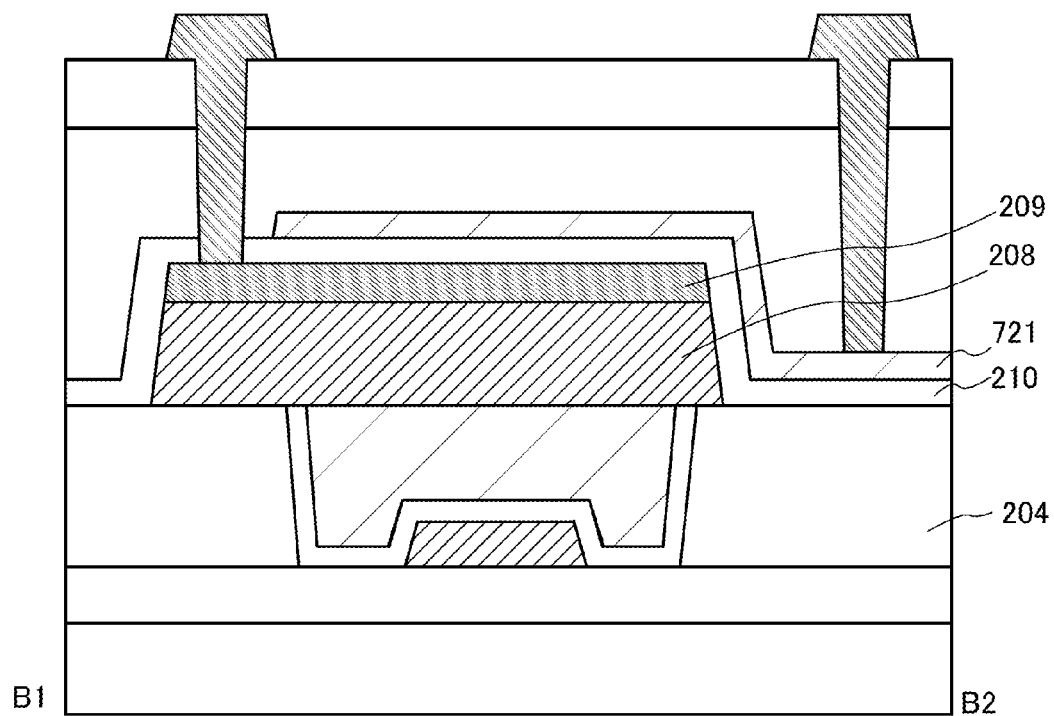

In this embodiment, a semiconductor device which has a structure different from that of the semiconductor device of Embodiment 1 is described with reference to FIGS. 11A and 11B. FIG. 11A is a cross-sectional view in the channel length direction and FIG. 11B is a cross-sectional view in the channel width direction.

A difference from the semiconductor device of Embodiment 1 is that a second gate electrode 721 covers side and top surfaces of the second oxide semiconductor layer 208 and the electrode 209 with the second gate insulating film 210 interposed therebetween.

For the second gate electrode 721, a material similar to the materials described for the second gate electrode 211 can be used.

This embodiment can be combined with any of the other embodiments in this specification as appropriate.

Embodiment 4

Figure 12A:
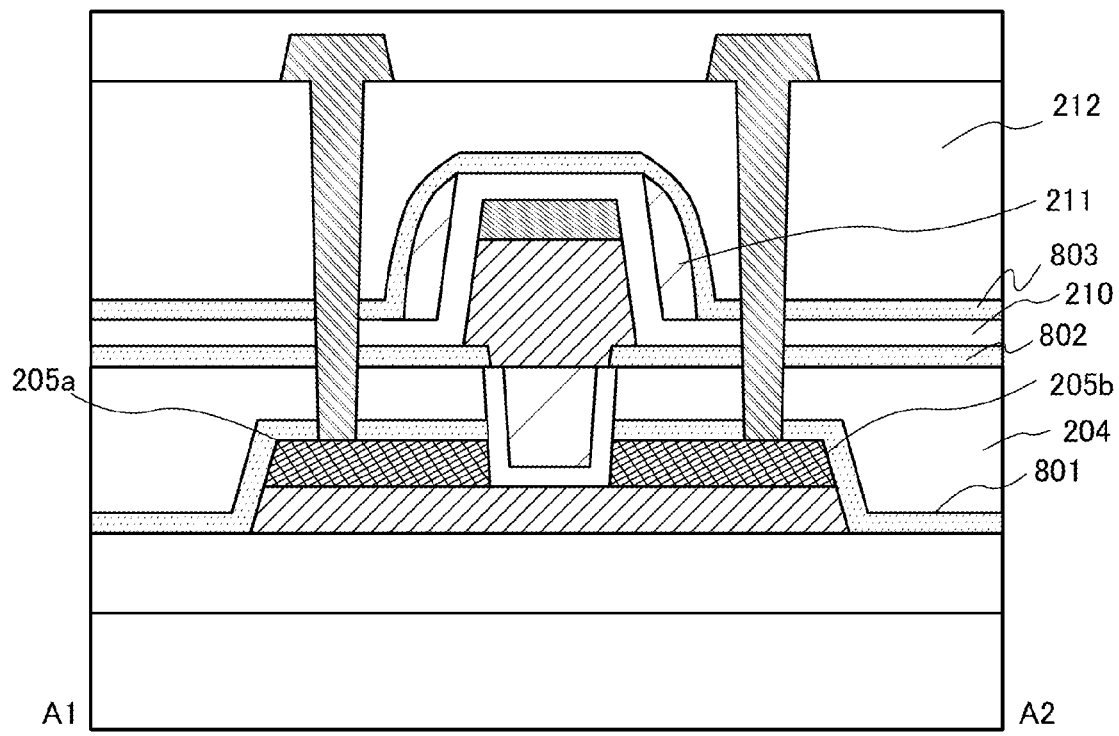
FIGS. 12A and 12B are cross-sectional views for illustrating a semiconductor device.
Figure 12B:
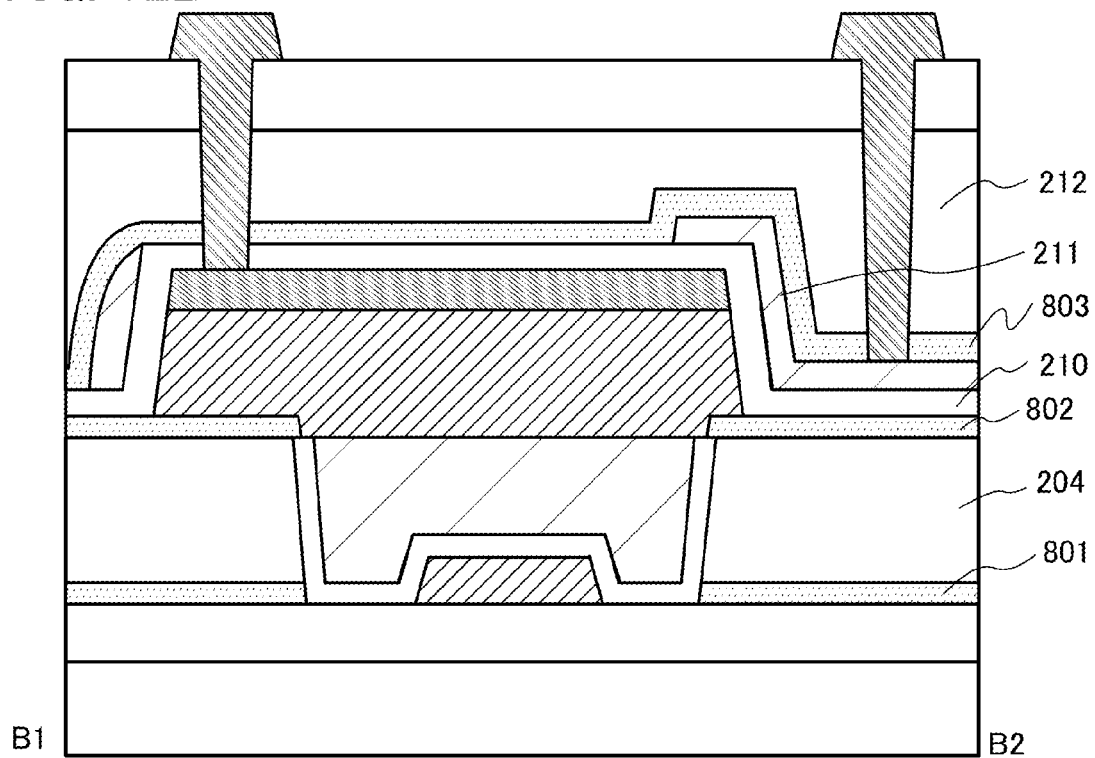

In this embodiment, a semiconductor device which has a structure different from that of the semiconductor device of Embodiment 1 is described with reference to FIGS. 12A and 12B. FIG. 12A is a cross-sectional view in the channel length direction and FIG. 12B is a cross-sectional view in the channel width direction.

Differences from the semiconductor device of Embodiment 1 are that a first protective film 801 is formed between the conductive layer 205a and the first interlayer insulating film 204 and between the conductive layer 205b and the first interlayer insulating film 204, a second protective film 802 is formed between the first interlayer insulating film 204 and the second gate insulating film 210, and a third protective film 803 is formed over the second gate insulating film 210 and the second gate electrode 211 and under the second interlayer insulating film 212. As each of the above protective films, a silicon nitride film, a silicon nitride oxide film, an aluminum oxide film, an aluminum nitride film, or the like can be used.

This embodiment can be combined with any of the other embodiments in this specification as appropriate.

Embodiment 5

Figure 13A:
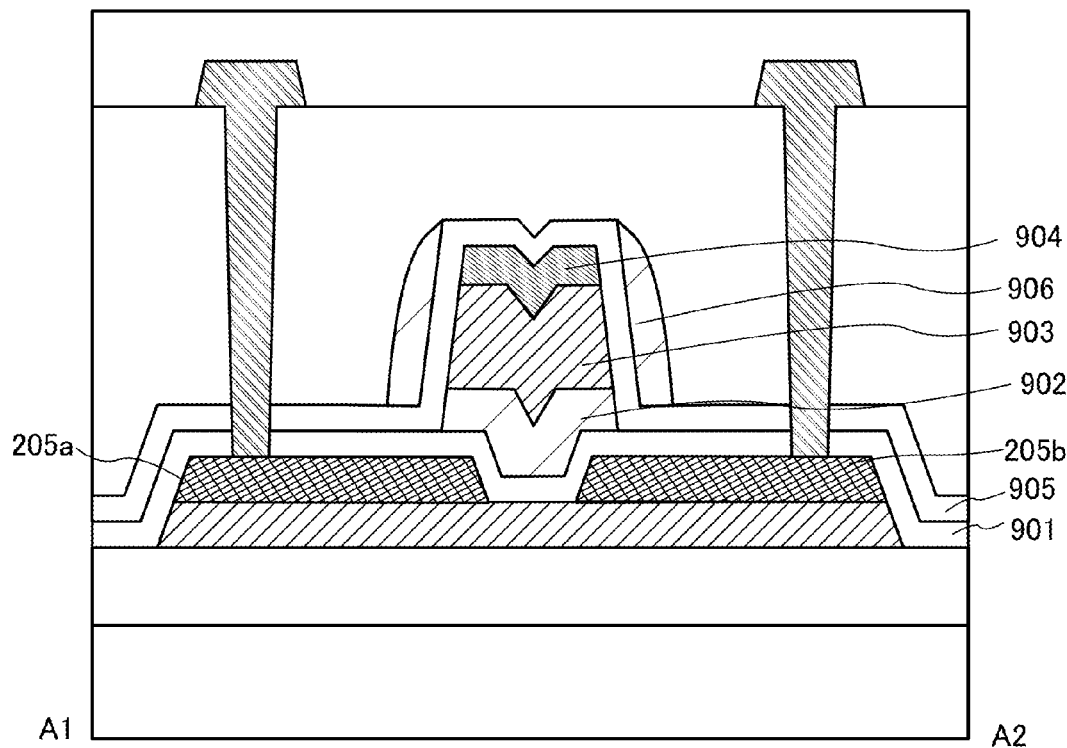
FIGS. 13A and 13B are cross-sectional views for illustrating a semiconductor device.
Figure 13B:
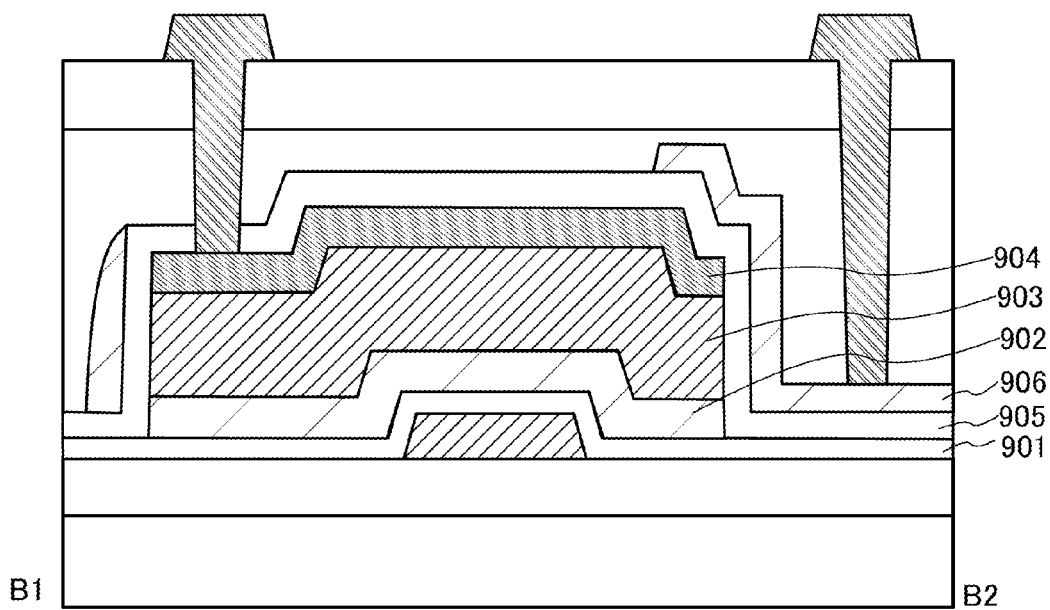

In this embodiment, a semiconductor device which has a structure different from that of the semiconductor device of Embodiment 1 is described with reference to FIGS. 13A and 13B. FIG. 13A is a cross-sectional view in the channel length direction and FIG. 13B is a cross-sectional view in the channel width direction.

After a first gate insulating film 901 is formed over the conductive layers 205a and 205b, a first gate electrode 902, a second oxide semiconductor layer 903, and a conductive layer 904 are stacked in this order. In the semiconductor device having such a structure, the first gate electrode 902, the second oxide semiconductor layer 903, and the conductive layer 904 can be formed in one etching step with one mask. Consequently, end portions of the first gate electrode 902, the second oxide semiconductor layer 903, and the conductive layer 904 are substantially aligned with each other, as illustrated in FIGS. 13A and 13B. Accordingly, the process can be simplified and the productivity can be improved.

Next, a second gate insulating film 905 is formed over the conductive layer 904, and a second gate electrode 906 is formed.

For the first gate insulating film 901, the first gate electrode 902, the second oxide semiconductor layer 903, the conductive layer 904, the second gate insulating film 905, and the second gate electrode 906, materials similar to those described for the first gate insulating film 206, the first gate electrode 207, the first oxide semiconductor layer 203, the electrode 209, the second gate insulating film 210, and the second gate electrode 211 can be used.

This embodiment can be combined with any of the other embodiments in this specification as appropriate.

Embodiment 6

Figure 14A:
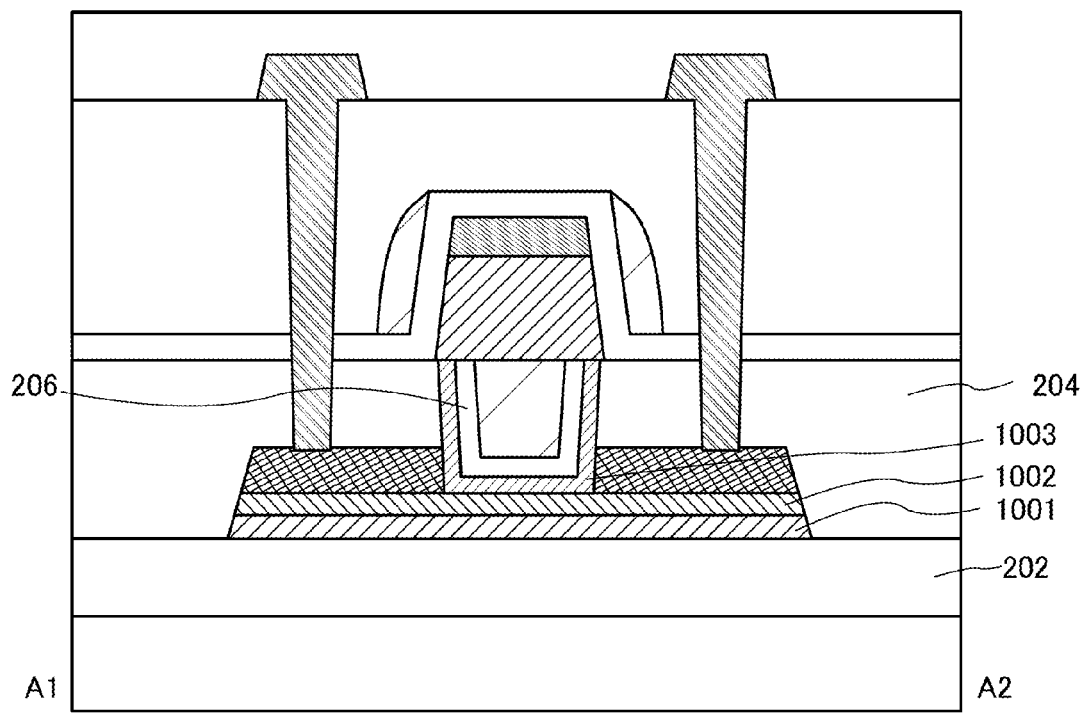
FIGS. 14A and 14B are cross-sectional views for illustrating a semiconductor device.
Figure 14B:
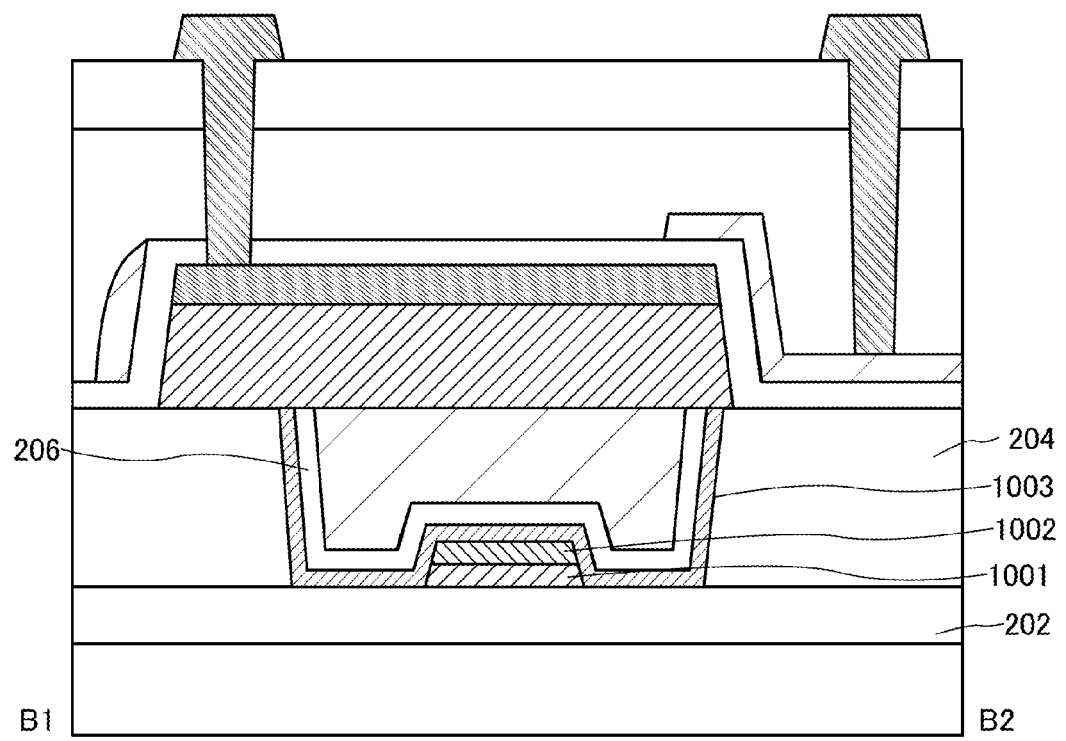

In this embodiment, a semiconductor device which has a structure different from that of the semiconductor device of Embodiment 1 is described with reference to FIGS. 14A and 14B. FIG. 14A is a cross-sectional view in the channel length direction and FIG. 14B is a cross-sectional view in the channel width direction.

A difference from the semiconductor device of Embodiment 1 is that a first oxide semiconductor layer 1001 over the insulating film 202, a second oxide semiconductor layer 1002 over the first oxide semiconductor layer 1001, and a third oxide semiconductor layer 1003 over the second oxide semiconductor layer 1002 are provided. The third oxide semiconductor layer 1003 is formed in an opening portion in the first interlayer insulating film 204 and between the second oxide semiconductor layer 1002 and the first gate insulating film 206.

The conductivity of the second oxide semiconductor layer is higher than those of the first oxide semiconductor layer and the third oxide semiconductor layer.

For the first oxide semiconductor layer 1001, the second oxide semiconductor layer 1002, and the third oxide semiconductor layer 1003, materials similar to the materials described for the first oxide semiconductor layer 203 in Embodiment 2 can be used. The first oxide semiconductor layer 1001 and the third oxide semiconductor layer 1003 preferably contain the same metal element as one or more of the metal elements contained in the second oxide semiconductor layer 1002.

Embodiment 7

In this embodiment, a CPU including the memory device described in Embodiment 1 is described.

Figure 15:
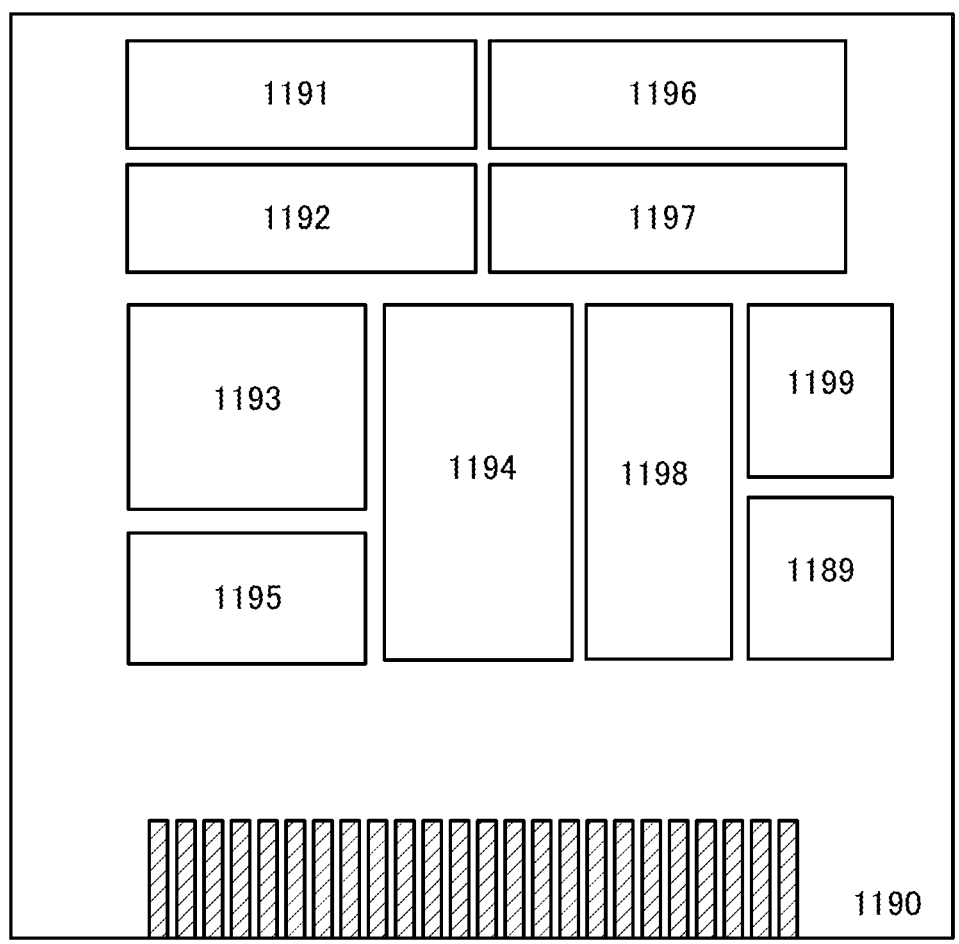
FIG. 15 is a block diagram of a semiconductor device.

FIG. 15 is a block diagram illustrating a configuration example of a CPU partly including the memory device described in Embodiment 1.

The CPU illustrated in FIG. 15 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 15 is just an example in which the configuration is simplified, and an actual CPU may have a variety of configurations depending on the application. For example, the CPU may have the following configuration: a structure including the CPU illustrated in FIG. 15 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 15, a memory cell is provided in the register 1196. For the memory cell of the register 1196, the transistors described in the above embodiments can be used.

In the CPU illustrated in FIG. 15, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

This embodiment can be combined with any of the other embodiments in this specification as appropriate.

Embodiment 8

In this embodiment, examples in which the memory device described in any of the above embodiments is used as an electronic component are described.

Figure 16A:
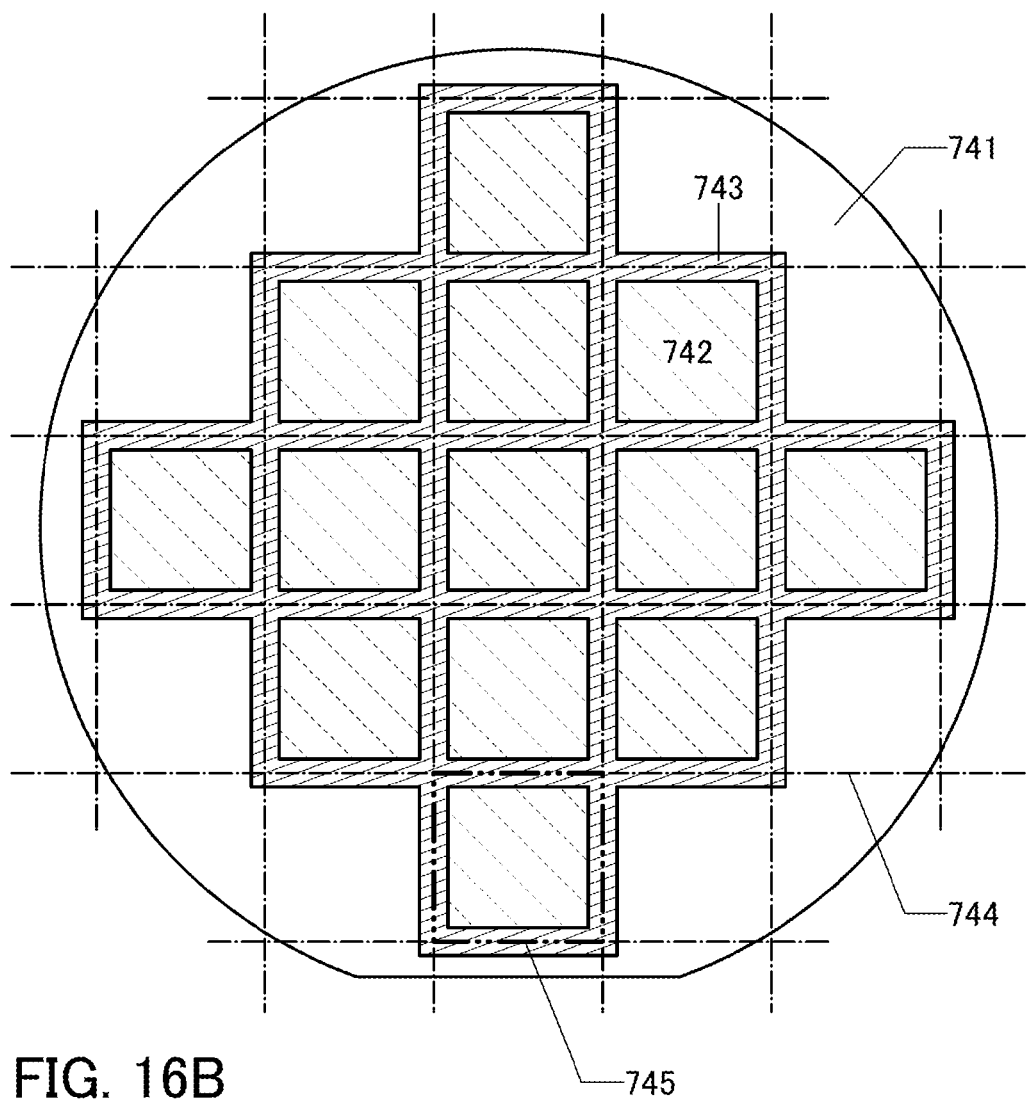
FIGS. 16A and 16B illustrate a separation method of a semiconductor substrate.
Figure 16B:
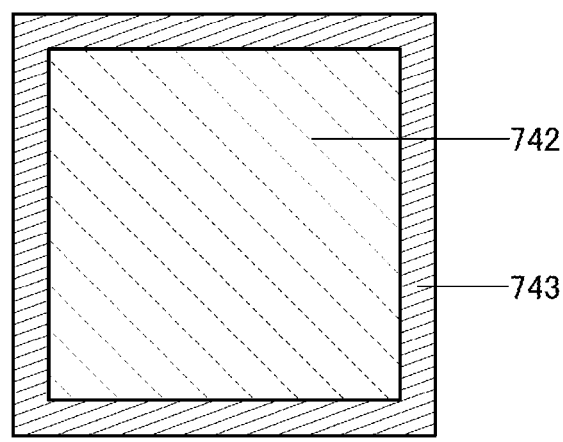

In an application method shown in FIGS. 16A and 16B, a single crystal semiconductor substrate or a polycrystalline semiconductor substrate made of silicon, silicon carbide, or the like, a compound semiconductor substrate made of silicon germanium, a silicon-on-insulator (SOI) substrate, or the like is used as the substrate 201. A semiconductor element is provided over any of these substrates.

FIG. 16A is a top view illustrating a substrate 741 before dicing treatment. As the substrate 741, a semiconductor substrate (also referred to as a "semiconductor wafer") can be used, for example. A plurality of circuit regions 742 are provided over the substrate 741. A semiconductor device, a CPU, or an RF tag according to one embodiment of the present invention, an image sensor, or the like can be provided in the circuit region 742.

The plurality of circuit regions 742 are each surrounded by a separation region 743. Separation lines (also referred to as "dicing lines") 744 are set at a position overlapping with the separation regions 743. The substrate 741 can be cut along the separation lines 744 into chips 745 including the circuit regions 742. FIG. 16B is an enlarged view of the chip 745.

A conductive layer or a semiconductor layer may be provided in the separation regions 743. Providing a conductive layer or a semiconductor layer in the separation regions 743 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 743 allows a reduction in the usage of the pure water. Therefore, the cost of manufacturing semiconductor devices can be reduced. Thus, semiconductor devices can be manufactured with improved productivity.

For a semiconductor layer provided in the separation regions 743, a material having a band gap greater than or equal to 2.5 eV and less than or equal to 4.2 eV, preferably greater than or equal to 2.7 eV and less than or equal to 3.5 eV is preferably used. The use of such a material allows accumulated charge to be released slowly; thus, the rapid move of charge due to ESD can be suppressed and electrostatic breakdown is less likely to occur.

Figure 17A:
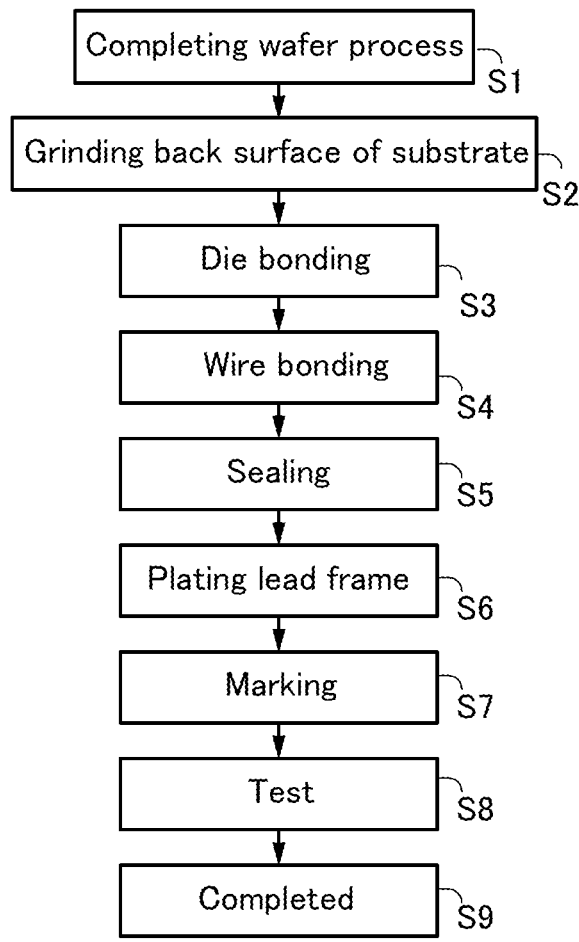
FIG. 17A is a flowchart showing a manufacturing process of an electronic component.

FIG. 17A shows an example where the memory device described in any of the above embodiments is used as an electronic component. Note that the electronic component is also referred to as semiconductor package or IC package. This electronic component has various standards and names corresponding to the direction of terminals or the shape of terminals; hence, one example of the electronic component is described in this embodiment.

A memory device including the transistors described in Embodiment 1 with reference to FIGS. 4A to 4C is completed through an assembly process (post-process) of integrating detachable components on a printed board.

The post-process can be completed through the steps in FIG. 17A. Specifically, after an element substrate obtained in the preceding process is completed (Step S1), a back surface of the substrate is ground (Step S2). The substrate is thinned in this step to reduce substrate warpage or the like caused in the preceding process and to reduce the size of the component.

After the back surface of the substrate is ground, a dicing step is performed to divide the substrate into a plurality of chips. Then, the divided chips are separately picked up, placed on a lead frame, and bonded thereto in a die bonding step (Step S3). In the die bonding step, the chip is bonded to the lead frame by an appropriate method depending on products, for example, bonding with a resin or a tape. Note that in the die bonding step, a chip may be placed on and bonded to an interposer.

Next, wire bonding for electrically connecting a lead of the lead frame and an electrode on the chip through a metal wire is performed (Step S4). As the metal wire, a silver wire or a gold wire can be used. Ball bonding or wedge bonding can be used as the wire bonding.

The wire-bonded chip is subjected to a molding step of sealing the chip with an epoxy resin or the like (Step S5). Through the molding step, the inside of the electronic component is filled with a resin, whereby damage to a mounted circuit portion and wire caused by external mechanical force as well as deterioration of characteristics due to moisture or dust can be reduced.

Subsequently, the lead of the lead frame is plated. Then, the lead is cut and processed (Step S6). This plating process prevents rust of the lead and facilitates soldering at the time of mounting the chip on a printed board in a later step.

Next, printing (marking) is performed on a surface of the package (Step S7). After a final testing step (Step S8), the electronic component is completed (Step S9).

The above-described electronic component includes the memory device described in any of the above embodiments. Thus, the electronic component which achieves higher-speed operation and a smaller size can be obtained.

Figure 17B:
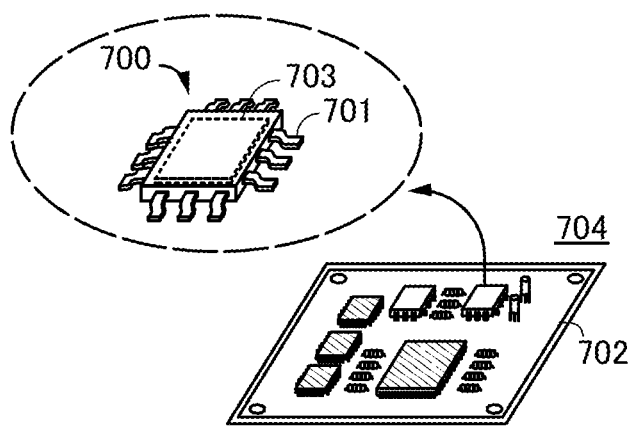
FIG. 17B is a schematic perspective view of the electronic component.

FIG. 17B is a perspective schematic diagram illustrating a quad flat package (QFP) as an example of the completed electronic component. An electronic component 700 in FIG. 17B includes a lead 701 and a circuit portion 703. The electronic component 700 in FIG. 17B is mounted on a printed board 702, for example. A plurality of electronic components 700 which are combined and electrically connected to each other over the printed board 702 can be mounted on an electronic device. A completed circuit board 704 is provided in an electronic device or the like.

This embodiment can be combined with any of the other embodiments in this specification as appropriate.

Embodiment 9

In this embodiment, examples of an electronic device that can include any of the memory device, the transistors, the CPU, and the like (e.g., a DSP, a custom LSI, a PLD, and an RF-ID) described in the above embodiments are described.

The transistor, the memory device, and the CPU and the like described in the above embodiments can be applied to a variety of electronic devices (including game machines). Examples of the electronic devices include display devices such as televisions and monitors, lighting devices, personal computers, word processors, image reproduction devices, portable audio players, radios, tape recorders, stereos, phones, cordless phones, mobile phones, car phones, transceivers, wireless devices, game machines, calculators, portable information terminals, electronic notebooks, e-book readers, electronic translators, audio input devices, video cameras, digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers and X-ray diagnostic equipment. The examples of the electronic devices also include alarm devices such as smoke detectors, heat detectors, gas alarm devices, and security alarm devices. The examples also include industrial equipment such as guide lights, traffic lights, belt conveyors, elevators, escalators, industrial robots, and power storage systems. Furthermore, moving objects and the like driven by fuel engines and electric motors using power from non-aqueous secondary batteries are also included in the category of electronic devices. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts. Some specific examples of these electronic devices are illustrated in FIGS. 17A to 17C.

Figure 18A:
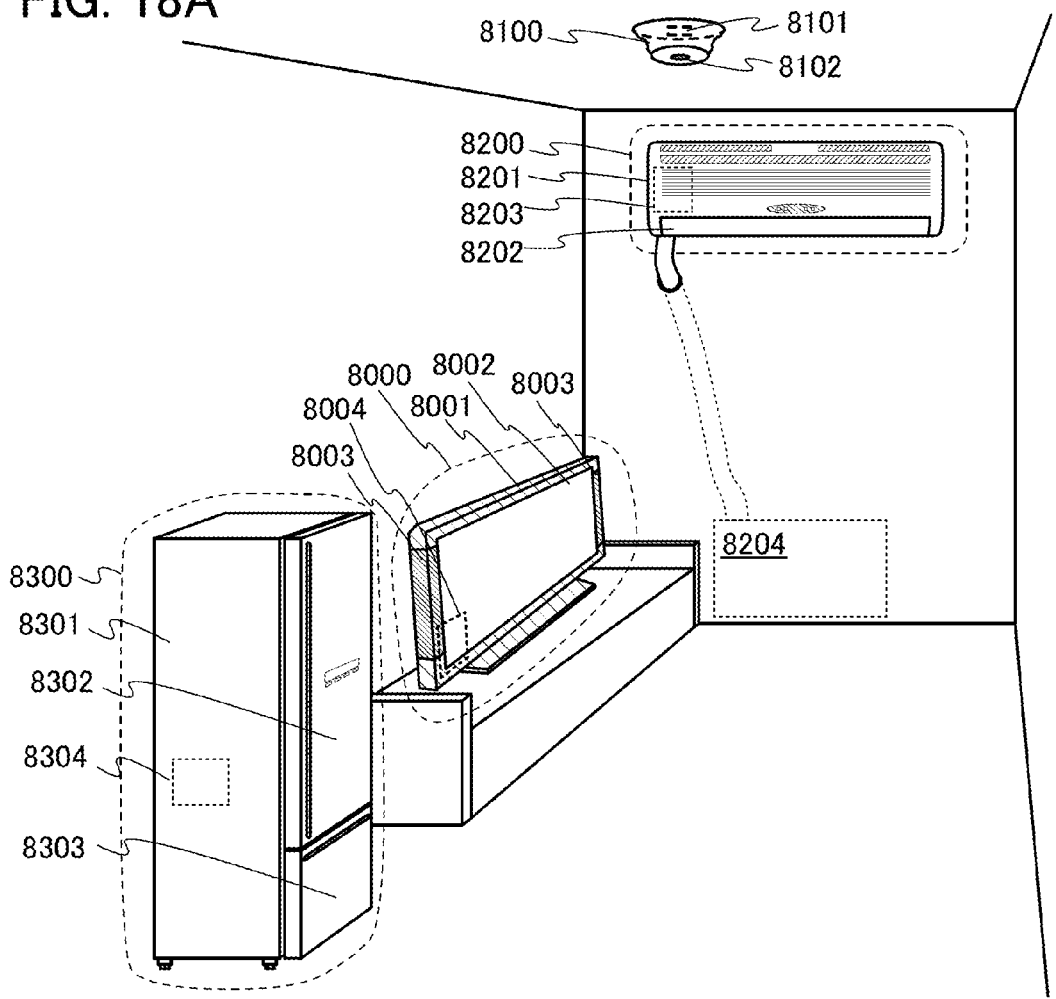
FIGS. 18A to 18C illustrate electronic devices to which semiconductor devices can be applied.

In a television set 8000 illustrated in FIG. 18A, a display portion 8002 is incorporated in a housing 8001. The display portion 8002 can display an image and a speaker portion 8003 can output sound. A memory device including the transistors of one embodiment of the present invention can be used for a driver circuit for operating the display portion 8002.

In addition, the television set 8000 may include a CPU 8004 for performing information communication or a memory. For the CPU 8004 and the memory, a CPU or a memory device including the transistors of one embodiment of the present invention can be used.

An alarm device 8100 illustrated in FIG. 18A is a residential fire alarm, and includes a smoke or heat sensor portion 8102 and a microcomputer 8101. The microcomputer 8101 is an example of an electronic device including any of the transistors, the memory device, and the CPU described in the above embodiments.

An air conditioner that includes an indoor unit 8200 and an outdoor unit 8204 illustrated in FIG. 18A is an example of an electronic device including any of the transistors, the memory device, the CPU, and the like described in the above embodiments. Specifically, the indoor unit 8200 includes a housing 8201, an air outlet 8202, a CPU 8203, and the like. Although the CPU 8203 is provided in the indoor unit 8200 in FIG. 18A, the CPU 8203 may be provided in the outdoor unit 8204. Alternatively, the CPU 8203 may be provided in each of the indoor unit 8200 and the outdoor unit 8204. When the transistors described in the above embodiments are used for the CPU in the air conditioner, reduction in power consumption of the air conditioner can be achieved.

An electric refrigerator-freezer 8300 illustrated in FIG. 18A is an example of an electronic device including any of the transistors, the memory device, the CPU, and the like described in the above embodiments. Specifically, the electric refrigerator-freezer 8300 includes a housing 8301, a door for a refrigerator 8302, a door for a freezer 8303, a CPU 8304, and the like. In FIG. 18A, the CPU 8304 is provided in the housing 8301. When the transistors described in the above embodiments are used for the CPU 8304 of the electric refrigerator-freezer 8300, power consumption of the electric refrigerator-freezer 8300 can be reduced.

Figure 18B:
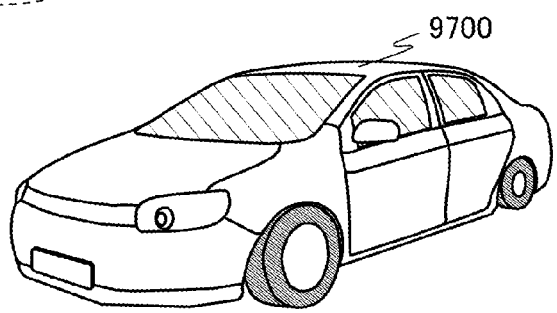
Figure 18C:
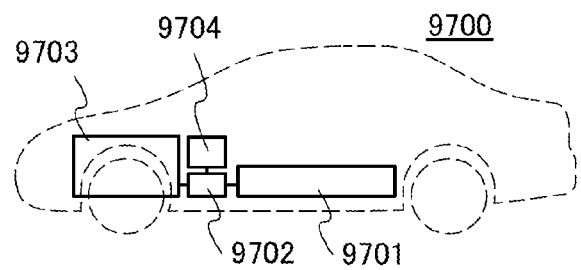

FIGS. 18B and 18C illustrate an example of an electric vehicle that is an example of an electronic device. An electric vehicle 9700 is equipped with a secondary battery 9701. The output of electric power of the secondary battery 9701 is adjusted by a circuit 9702 and the electric power is supplied to a driving device 9703. The circuit 9702 is controlled by a processing unit 9704 including a ROM, a RAM, a CPU, or the like that is not illustrated. When the transistors described in the above embodiments are used for the CPU in the electric vehicle 9700, power consumption of the electric vehicle 9700 can be reduced.

In the driving device 9703, a DC motor or an AC motor is included either alone or in combination with an internal-combustion engine. The processing unit 9704 outputs a control signal to the circuit 9702 based on input data such as data on operation (e.g., acceleration, deceleration, or stop) by a driver or data during driving (e.g., data on an upgrade or a downgrade, or data on a load on a driving wheel) of the electric vehicle 9700. The circuit 9702 adjusts the electric energy supplied from the secondary battery 9701 in accordance with the control signal of the processing unit 9704 to control the output of the driving device 9703. In the case where the AC motor is mounted, although not illustrated, an inverter, which converts direct current into alternate current, is also incorporated.

This embodiment can be combined with any of the other embodiments in this specification as appropriate.

This application is based on Japanese Patent Application serial No. 2016-009389 filed with Japan Patent Office on Jan. 21, 2016, the entire contents of which are hereby incorporated by reference.

What is claimed is:

1. A semiconductor device comprising:
a NAND including a first to m-th memory cells, each of the memory cells comprising:
a first terminal;
a second terminal;
a third terminal;
a fourth terminal;
a first semiconductor layer;
a drain electrode electrically connected to the first semiconductor layer;
a source electrode electrically connected to the first semiconductor layer;
a first gate insulating film over the first semiconductor layer;
a first gate electrode over the first gate insulating film;
a second semiconductor layer over the first gate electrode;
a conductive layer over the second semiconductor layer;
a second gate insulating film covering the second semiconductor layer and the conductive layer; and
a second gate electrode covering at least part of a side surface of the second semiconductor layer with the second gate insulating film therebetween,
wherein an end portion of the second semiconductor layer has a shape substantially conforming to an end portion of the conductive layer,
wherein the drain electrode is electrically connected to the first terminal,
wherein the source electrode is electrically connected to the second terminal,
wherein the conductive layer is electrically connected to the second terminal, and
wherein a second gate electrode is electrically connected to the fourth terminal,
wherein m is a natural number greater than or equal to 3.

2. The semiconductor device according to claim 1, further comprising:
a bit line;
a selection transistor;
m word lines;
a source line;
m signal lines;
a first driver circuit electrically connected to the bit line;
a second driver circuit electrically connected to the m word lines;
a third driver circuit electrically connected to the m signal lines;
a fourth driver circuit electrically connected to a gate electrode of the selection transistor; and
a fifth driver circuit electrically connected to the source line,
wherein m is a natural number greater than or equal to 3,
wherein the first terminal of the first memory cell is electrically connected to a drain electrode of the selection transistor,
wherein the drain electrode of the selection transistor is electrically connected to the bit line,
wherein the first terminal of the j-th memory cell is electrically connected to the second terminal of the (j−1)-th memory cell,
wherein j is a natural number greater than or equal to 2 and less than or equal to m,
wherein the second terminal of the m-th memory cell is electrically connected to the source line,
wherein the third terminal of the k-th memory cell is electrically connected to the k-th word line,
wherein k is a natural number greater than or equal to 1 and less than or equal to m, and
wherein the k-th signal line is electrically connected to the fourth terminal of the k-th memory cell.

3. The semiconductor device according to claim 1, wherein the first semiconductor layer and the second semiconductor layer are oxide semiconductor layers.

4. A semiconductor device comprising:
a NAND including a first to m-th memory cells, each of the memory cells comprising:
a first terminal;
a second terminal;
a third terminal;
a fourth terminal;
a first semiconductor layer;
a pair of electrodes over the first semiconductor layer;
an interlayer film over the pair of electrodes, the interlayer film including an opening;
a first gate insulating film connected to a top surface of the first semiconductor layer in the opening;
a first gate electrode over the first gate insulating film;
a second semiconductor layer over the first gate electrode;
a conductive layer over the second semiconductor layer;
a second gate insulating film covering the second semiconductor layer and the conductive layer; and
a second gate electrode covering at least part of a side surface of the second semiconductor layer with the second gate insulating film therebetween,
wherein an end portion of the second semiconductor layer has a shape conforming to an end portion of the conductive layer,
wherein one of the pair of electrodes is electrically connected to the first terminal,
wherein the other of the pair of electrodes is electrically connected to the second terminal,
wherein the conductive layer is electrically connected to the second terminal, and
wherein the second gate electrode is electrically connected to the fourth terminal,
wherein m is a natural number greater than or equal to 3.

5. The semiconductor device according to claim 4, further comprising:
a bit line;
a selection transistor;
m word lines;
a source line;
m signal lines;
a first driver circuit electrically connected to the bit line;
a second driver circuit electrically connected to the m word lines;
a third driver circuit electrically connected to the m signal lines;
a fourth driver circuit electrically connected to a gate electrode of the selection transistor; and
a fifth driver circuit electrically connected to the source line,
wherein m is a natural number greater than or equal to 3, wherein the first terminal of the first memory cell is electrically connected to a drain electrode of the selection transistor, wherein the drain electrode of the selection transistor is electrically connected to the bit line, wherein the first terminal of the j-th memory cell is electrically connected to the second terminal of the (j−1)-th memory cell, wherein j is a natural number greater than or equal to 2 and less than or equal to m, wherein the second terminal of the m-th memory cell is electrically connected to the source line, wherein the third terminal of the k-th memory cell is electrically connected to the k-th word line, wherein k is a natural number greater than or equal to 1 and less than or equal to m, and wherein the k-th signal line is electrically connected to the fourth terminal of the k-th memory cell.

6. The semiconductor device according to claim 4, wherein the first semiconductor layer and the second semiconductor layer are oxide semiconductor layers.

7. A method for driving a memory device,
wherein the memory device comprises a memory cell, the memory cell comprising:
a first semiconductor layer;
a first gate insulating film over the first semiconductor layer;
a first gate electrode over the first gate insulating film;
a second semiconductor layer over the first gate electrode;
a conductive layer over the second semiconductor layer;
a second gate insulating film covering the conductive layer and the second semiconductor layer; and
a second gate electrode covering at least part of a side surface of the second semiconductor layer with the second gate insulating film therebetween,
wherein the first gate electrode, the second semiconductor layer, and the conductive layer overlap with one another, the method for driving the memory device comprising:
a step of writing data to the memory device; and
a step of reading the data,
wherein in the step of writing, the conductive layer is electrically connected to the first gate electrode through the second semiconductor layer under application of an voltage to the first gate electrode,
wherein in the step of reading, the conductive layer is electrically disconnected to the first gate electrode under application of another voltage to the first gate electrode,
wherein the first gate electrode has three or more kinds of different potentials when the data is written to the memory device, and
wherein the data is written, erased, and read page by page composed of a plurality of memory cells that shares a word line.

* * * * *